(12) United States Patent
Beaudoin et al.

(10) Patent No.: US 9,385,131 B2
(45) Date of Patent: Jul. 5, 2016

(54) WRAP-AROUND FIN FOR CONTACTING A CAPACITOR STRAP OF A DRAM

(75) Inventors: Felix Beaudoin, Beacon, NY (US); Stephen M. Lucarini, Pleasant Valley, NY (US); Xinhui Wang, Poughkeepsie, NY (US); Xinlin Wang, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 225 days.

(21) Appl. No.: 13/484,739

(22) Filed: May 31, 2012

(65) Prior Publication Data

US 2013/0320423 A1    Dec. 5, 2013

(51) Int. Cl.
*H01L 27/108*    (2006.01)
*H01L 27/12*    (2006.01)
*H01L 21/8242*   (2006.01)

(52) U.S. Cl.
CPC .... *H01L 27/10867* (2013.01); *H01L 27/10826* (2013.01); *H01L 27/10829* (2013.01); *H01L 27/10879* (2013.01); *H01L 27/1207* (2013.01); *H01L 27/1211* (2013.01)

(58) Field of Classification Search
CPC .......... H01L 27/10826; H01L 27/10829; H01L 27/10867; H01L 27/10879; H01L 27/1207; H01L 27/1211
USPC ............ 257/301, E21.646, E27.084; 438/243
See application file for complete search history.

(56) References Cited

U.S. PATENT DOCUMENTS 5,585,285 A * 12/1996 Tang ................. H01L 27/10829
                                                   257/68
6,664,582 B2   12/2003 Fried et al.
6,998,676 B2    2/2006 Kondo et al.
7,145,220 B2   12/2006 Morikado
7,445,985 B2   11/2008 Schwerin
(Continued)

FOREIGN PATENT DOCUMENTS

JP    2008300816 A    12/2008

OTHER PUBLICATIONS

U.S. Appl. No. 13/484,657, filed May 31, 2012, Entitled: finFET Contacting a Conductive Strap Structure of a DRAM, First Named Inventor: Josephine B. Chang.
(Continued)

*Primary Examiner* — Ori Nadav
*Assistant Examiner* — Ernest Allen, III
(74) *Attorney, Agent, or Firm* — Scully, Scott, Murphy & Presser, P.C.

(57) ABSTRACT

A conductive strap structure in lateral contact with a top semiconductor layer is formed on an inner electrode of a deep trench capacitor. A cavity overlying the conductive strap structure is filled a dielectric material to form a dielectric capacitor cap having a top surface that is coplanar with a topmost surface of an upper pad layer. A semiconductor mandrel in lateral contact with the dielectric capacitor cap is formed. The combination of the dielectric capacitor cap and the semiconductor mandrel is employed as a protruding structure around which a fin-defining spacer is formed. The semiconductor mandrel is removed, and the fin-defining spacer is employed as an etch mask in an etch process that etches a lower pad layer and the top semiconductor layer to form a semiconductor fin that laterally wraps around the conductive strap structure. An access finFET is formed employing two parallel portions of the semiconductor fin.

12 Claims, 52 Drawing Sheets

(56) References Cited

U.S. PATENT DOCUMENTS

| | | |
|---|---|---|
| 7,615,443 B2 | 11/2009 | Cheng et al. |
| 7,674,674 B2 | 3/2010 | Furukawa et al. |
| 7,763,513 B2 | 7/2010 | Wang et al. |
| 7,811,881 B2 | 10/2010 | Cheng et al. |
| 7,834,395 B2 | 11/2010 | Temmler et al. |
| 7,898,014 B2 | 3/2011 | Cheng et al. |
| 7,911,028 B2 | 3/2011 | Lin et al. |
| 7,981,736 B2 | 7/2011 | Juengling |
| 2004/0150071 A1 | 8/2004 | Kondo et al. |
| 2004/0195610 A1* | 10/2004 | Morikado ............ H01L 21/84 257/300 |
| 2004/0217430 A1* | 11/2004 | Chu .............................. 257/410 |
| 2004/0251485 A1* | 12/2004 | Kito et al. .................... 257/301 |
| 2005/0145913 A1 | 7/2005 | Katsumata et al. |
| 2005/0247966 A1 | 11/2005 | Adkisson et al. |
| 2006/0054958 A1 | 3/2006 | Weis et al. |
| 2006/0172497 A1 | 8/2006 | Hareland et al. |
| 2006/0231929 A1* | 10/2006 | Anderson et al. ............. 257/623 |
| 2007/0057301 A1 | 3/2007 | Wang et al. |
| 2007/0138523 A1 | 6/2007 | Popp et al. |
| 2008/0206934 A1* | 8/2008 | Jones et al. .................. 438/151 |
| 2008/0220586 A1 | 9/2008 | Cheng et al. |
| 2008/0299734 A1 | 12/2008 | Lee et al. |
| 2008/0318377 A1 | 12/2008 | Lee et al. |
| 2009/0061580 A1 | 3/2009 | Cheng et al. |
| 2009/0134442 A1 | 5/2009 | Lin et al. |
| 2009/0184357 A1 | 7/2009 | Wu |
| 2010/0013013 A1 | 1/2010 | Mouli |
| 2011/0204419 A1 | 8/2011 | Johnson et al. |
| 2011/0248326 A1 | 10/2011 | Kanakasabapathy et al. |
| 2013/0174103 A1 | 7/2013 | Shieh et al. |

OTHER PUBLICATIONS

Office Action dated Jul. 31, 2014 received in U.S. Appl. No. 13/484,657.

Office Action dated Apr. 15, 2015 received in U.S. Appl. No. 14/516,744.

Final Office Action dated Oct. 22, 2015 received in U.S. Appl. No. 14/516,744.

Final Office Action dated Jan. 15, 2016 received in U.S. Appl. No. 13/484,657.

US non-Final Office Action dated Apr. 14, 2016 received in U.S. Appl. No. 14/516,721.

* cited by examiner

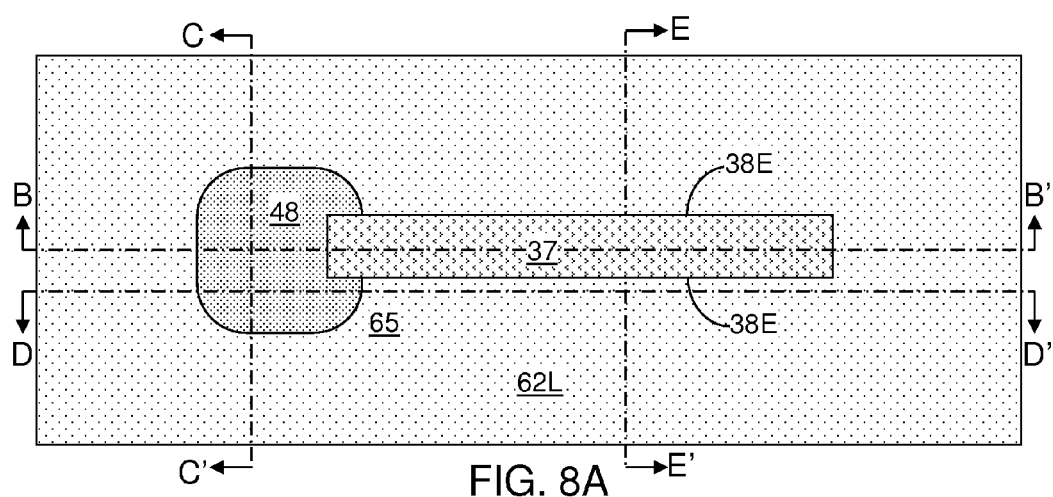

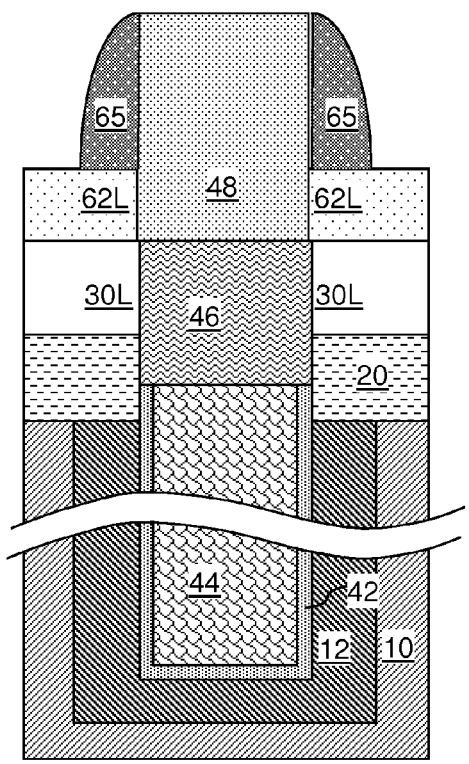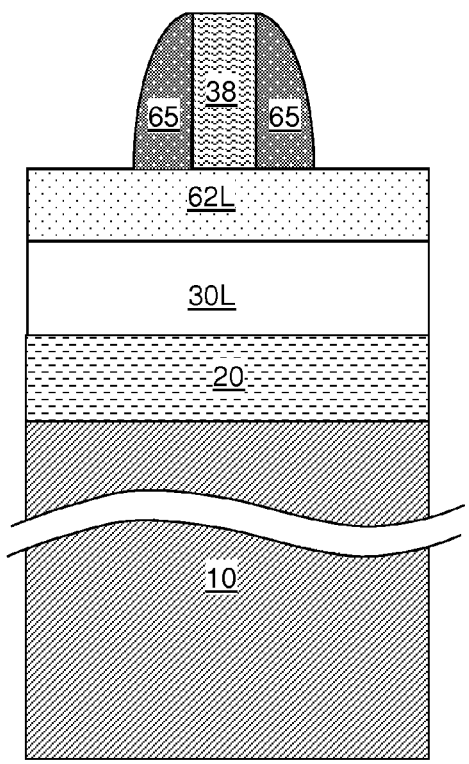
FIG. 9C                    FIG. 9E

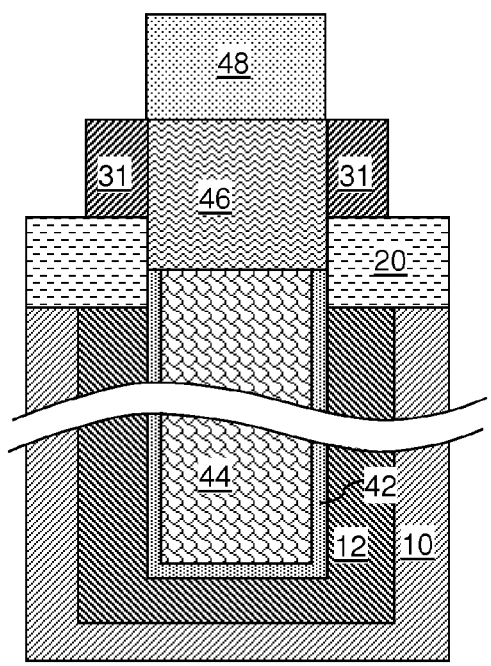 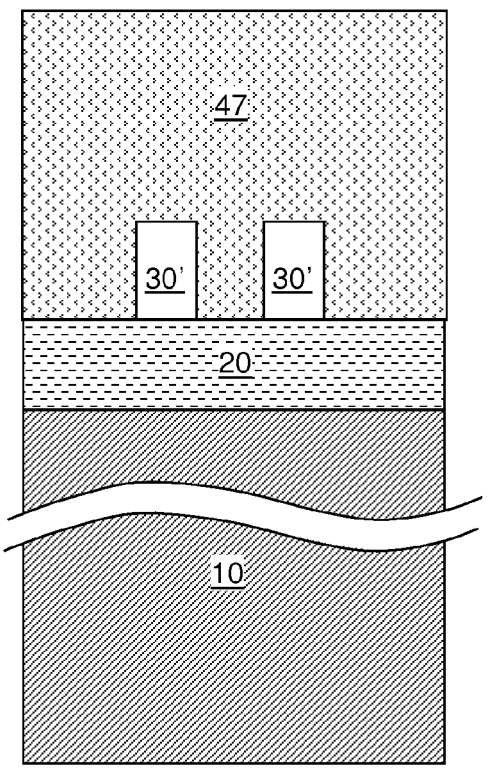
FIG. 13C                    FIG. 13E

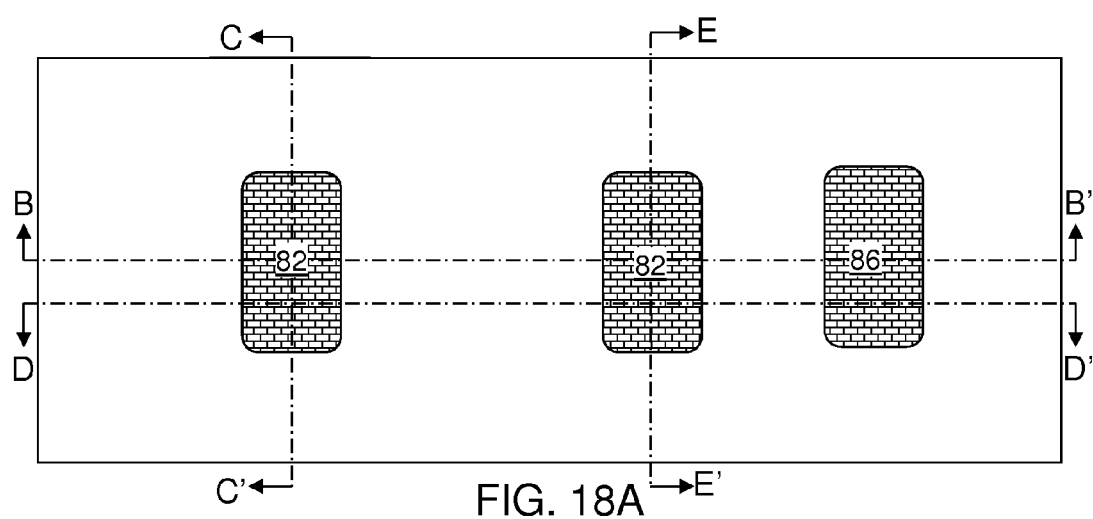

WRAP-AROUND FIN FOR CONTACTING A
CAPACITOR STRAP OF A DRAM

BACKGROUND

The present disclosure relates to a semiconductor structure, and particularly to a dynamic random access memory (DRAM) cell including a finFET access transistor and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

As dimensions of semiconductor devices scale, providing a robust low resistance path for electrical conduction between an inner electrode of a transistor and the source of an access transistor becomes a challenge because available area for forming a conductive strap structure decreases. However, because the read time and the write time of a DRAM cell is proportional to the product of the capacitance of a capacitor in the DRAM cell and the resistance of an electrically conductive path connected to the capacitor, a low resistance conductive path between the capacitor and the access transistor is required in order to reduce the read time and the write time of the DRAM cell.

BRIEF SUMMARY

A conductive strap structure in lateral contact with a top semiconductor layer is formed on an inner electrode of a deep trench capacitor. A cavity overlying the conductive strap structure is filled a dielectric material to form a dielectric capacitor cap having a top surface that is coplanar with a topmost surface of an upper pad layer. The upper pad layer is replaced with a semiconductor material layer, which is subsequently patterned to define a semiconductor mandrel in lateral contact with the dielectric capacitor cap. The combination of the dielectric capacitor cap and the semiconductor mandrel is employed as a protruding structure around which a fin-defining spacer is formed. The semiconductor mandrel is removed, and the fin-defining spacer is employed as an etch mask in an etch process that etches a lower pad layer and the top semiconductor layer to form a semiconductor fin that laterally wraps around the conductive strap structure. An access finFET is formed employing two parallel portions of the semiconductor fin.

According to an aspect of the present disclosure, a semiconductor structure includes a trench capacitor embedded in a substrate. The trench capacitor includes an inner electrode, a node dielectric, and an outer electrode. The semiconductor structure further includes a conductive strap structure that is in contact with, and overlies, the inner electrode. Further, the semiconductor structure includes a semiconductor fin that includes a pair of channel regions. A distal sidewall of the conductive strap structure that is laterally offset by a greater distance from the pair of channel regions than a lateral distance between a geometrical center of the conductive strap structure and the pair of channel regions is in contact with the semiconductor fin.

According to another aspect of the present disclosure, a method of forming a semiconductor structure is provided. A trench capacitor including an inner electrode, a node dielectric, and an outer electrode is formed in a semiconductor-on-insulator (SOI) substrate. A conductive strap structure is formed on the inner electrode. A set of masking structures overlying the conductive strap structure and a portion of a top semiconductor layer of the SOI substrate is subsequently formed. A fin-defining spacer is formed on sidewalls of the set of masking structures. A semiconductor fin is formed by transferring a pattern of the fin-defining spacer into the top semiconductor layer.

BRIEF DESCRIPTION OF SEVERAL VIEWS OF THE DRAWINGS

FIG. 8A is a top-down view of the first exemplary semiconductor structure after formation of a mask material portion by patterning the mask material layer according to the first embodiment of the present disclosure.

FIG. 9C is a vertical cross-sectional view of the first exemplary semiconductor structure along the vertical plane C-C' of FIG. 9A.

FIG. 9E is a vertical cross-sectional view of the first exemplary semiconductor structure along the vertical plane E-E' of FIG. 9A.

FIG. 13C is a vertical cross-sectional view of the first exemplary semiconductor structure along the vertical plane C-C' of FIG. 13A.

FIG. 13E is a vertical cross-sectional view of the first exemplary semiconductor structure along the vertical plane E-E' of FIG. 13A.

FIG. 18A is a top-down view of the second variation of the first exemplary semiconductor structure after formation of a source region and a drain region, a contact-level dielectric layer, and various contact via structures according to the first embodiment of the present disclosure.

DETAILED DESCRIPTION

Figure 1A:
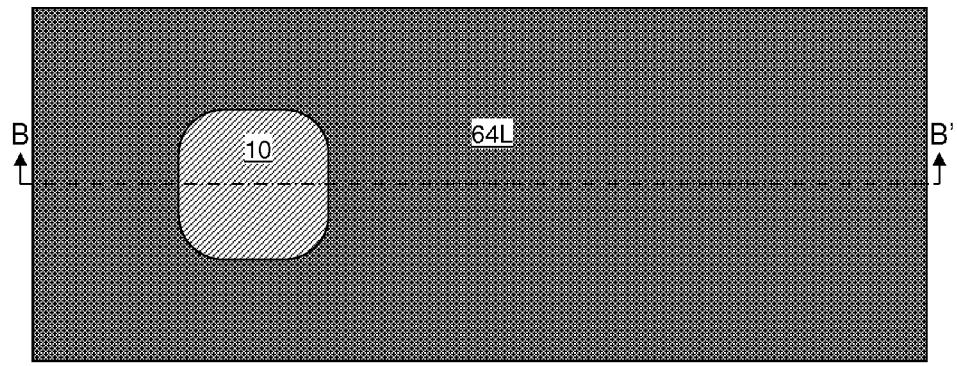
FIG. 1A is a top-down view of a first exemplary semiconductor structure after formation of a deep trench through a semiconductor-on-insulator (SOI) substrate according to a first embodiment of the present disclosure.

As stated above, the present disclosure relates to a semiconductor structure including a dynamic random access memory (DRAM) cell including a finFET access transistor and a method of manufacturing the same. These aspects of the present disclosure are now described in detail with accompanying figures. It is noted that like reference numerals refer to like elements across different embodiments. The drawings are not necessarily drawn to scale.

Figure 1B:
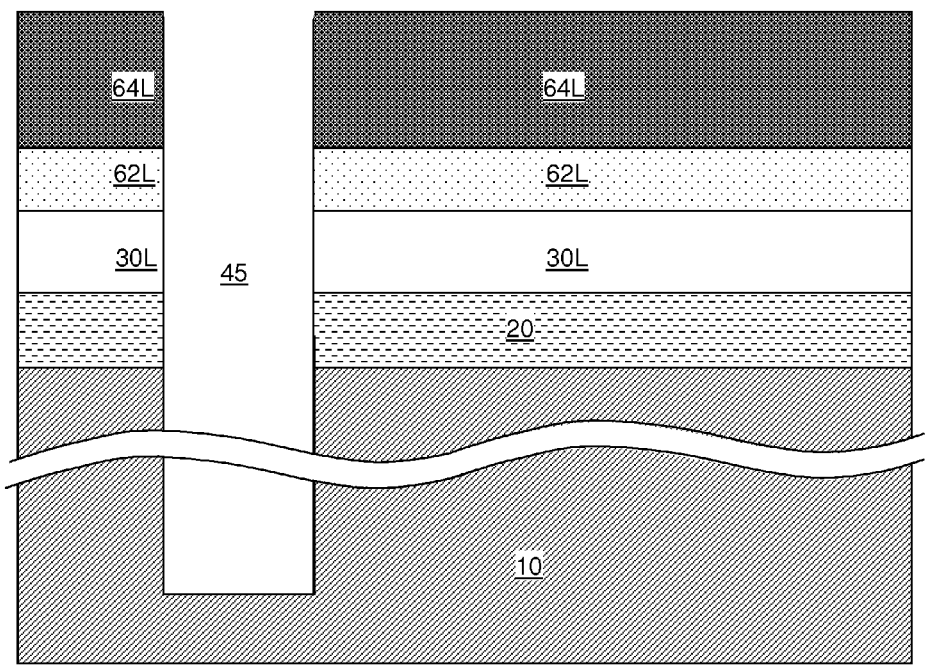
FIG. 1B is a vertical cross-sectional view of the first exemplary semiconductor structure along the vertical plane B-B' of FIG. 1A.

Referring to FIGS. 1A and 1B, a first exemplary semiconductor structure according to a first embodiment of the present disclosure includes a semiconductor-on-insulator (SOI) substrate. The SOI substrate includes a stack, from bottom to top, of a bottom semiconductor layer 10, a buried insulator layer 20, and a top semiconductor layer 30L.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 50 nm to 1,000 nm, and the thickness of the bottom semiconductor layer 10 can be from 50 microns to 2 mm, although lesser and greater thicknesses can also be employed for each of these layers (10, 20, 30L).

At least one pad layer can be deposited on the SOI substrate (10, 20, 30L), for example, by chemical vapor deposition (CVD) or atomic layer deposition (ALD). The at least one pad layer can include one or more layers that can be employed as an etch mask for forming a deep trench 45 in the SOI substrate (10, 20, 30L). As used herein, a "deep trench" refers to a trench that extends from a topmost surface of a semiconductor-on-insulator (SOI) substrate through a top semiconductor layer and a buried insulator layer and partly into an underlying semiconductor layer.

In one embodiment, each of the at least one pad layer can include a dielectric material such as silicon nitride, a dielectric metal nitride, a doped silicon undoped silicon oxide, or a dielectric metal oxide. The total thickness of the at least one pad layer can be from 100 nm to 2,000 nm, although lesser and greater thicknesses can also be employed.

In one embodiment, the at least one pad layer includes a stack of a lower pad layer 62L and an upper pad layer 64L. The lower pad layer 62L includes a first dielectric material, and the upper pad layer 64L includes a second dielectric material that is different from the first dielectric material. In one embodiment, the lower pad layer 62L can include silicon oxide, and the upper pad layer 64L can include silicon nitride. In one embodiment, the thickness of the lower pad layer 62L can be from 10 nm to 100 nm, and the thickness of the upper pad layer 64L can be from 40 nm to 360 nm, although lesser and greater thicknesses can also be employed for each of the lower pad layer 62L and the upper pad layer 64L.

A photoresist layer (not shown) can be applied over the at least one pad layer (62L, 64L) and can be lithographically patterned to form at least one opening having an area of a deep trench 45 to be subsequently formed. The pattern in the photoresist layer can be transferred into the at least one pad layer (62L, 64L). Subsequently, the pattern in the at least one pad layer (62L, 64L) can be transferred through the top semiconductor layer 30L, the buried insulator layer 20, and an upper portion of the bottom semiconductor layer 10 by an anisotropic etch that employs the at least one pad layer (62L, 64L) as an etch mask. A deep trench 45 can be formed for each opening in the at least one pad layer (62L, 64L). The photoresist can be removed by ashing, or can be consumed during the etch process that forms the deep trench 45.

The sidewalls of the deep trench 45 can be substantially vertically coincident among the various layers (64L, 62L, 30L, 20, 10) through which the deep trench 45 extends. As used herein, sidewalls of multiple elements are "vertically coincident" if the sidewalls of the multiple elements overlap in a top-down view such as FIG. 1A. As used herein, sidewalls of multiple elements are "substantially vertically coincident" if the lateral offset of the sidewalls of the multiple elements from a perfectly vertical surface is within 5 nm. The depth of the deep trench 45 as measured from the plane of the topmost surface of the SOI substrate (10, 20, 30L) to the bottom surface of the deep trench 45 can be from 500 nm to 10 microns, although lesser and greater depths can also be employed. The lateral dimensions of the deep trench 45 can be limited by the lithographic capabilities, i.e., the ability of a lithographic tool to print the image of an opening on the photoresist layer. In one embodiment, the "width," i.e., a sidewall to sidewall distance, of the deep trench along the direction parallel to the B-B' plane and along the direction perpendicular to the B-B' plane can be from 32 nm to 150 nm, although lesser dimensions can be employed with availability of lithographic tools capable of printing smaller dimensions in the future.

Figure 2A:
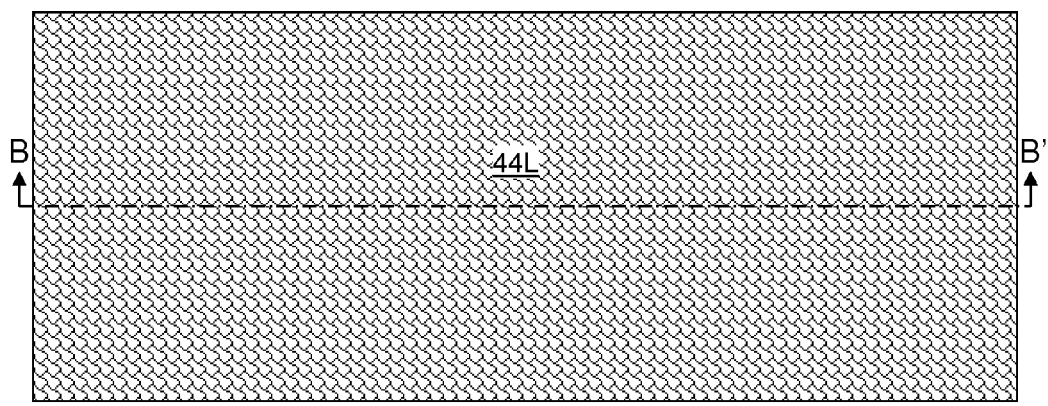
FIG. 2A is a top-down view of the first exemplary semiconductor structure after formation of a node dielectric layer and an inner electrode layer in the deep trench according to the first embodiment of the present disclosure.
Figure 2B:
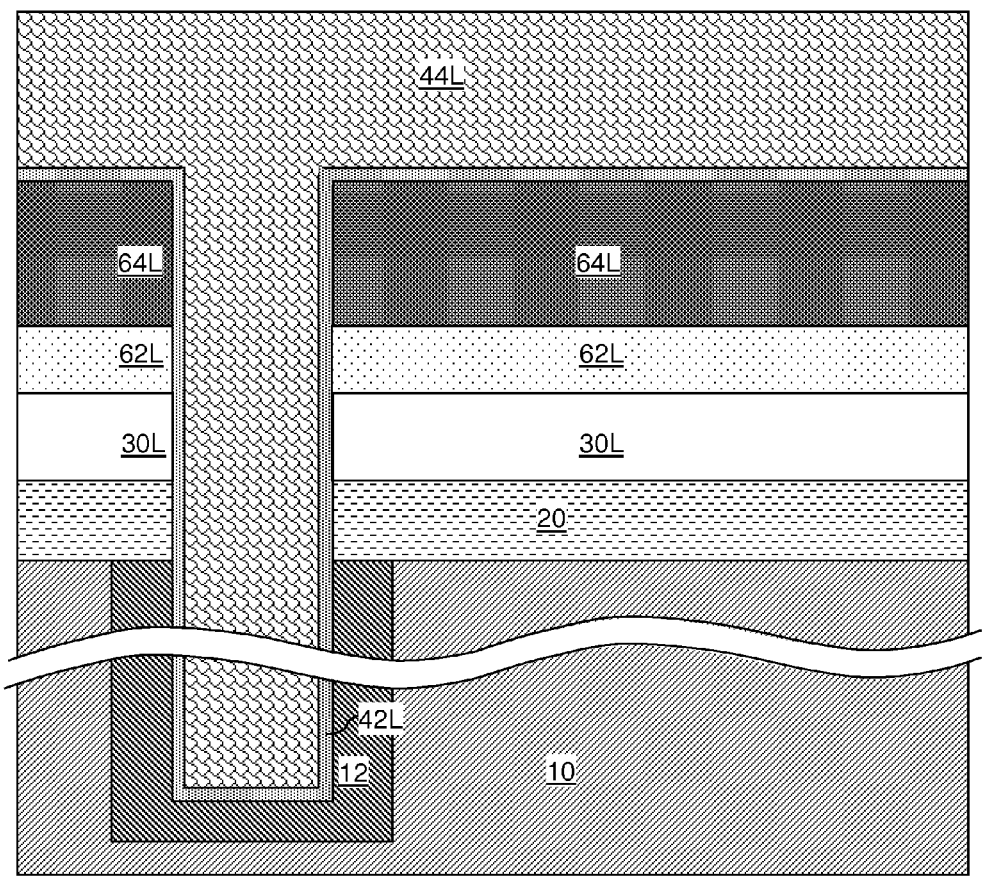
FIG. 2B is a vertical cross-sectional view of the first exemplary semiconductor structure along the vertical plane B-B' of FIG. 2A.

Referring to FIGS. 2A and 2B, a buried plate 12 can be formed by doping a portion of the bottom semiconductor layer 12 in proximity of sidewalls of the bottom semiconductor layer 10 within each deep trench 45. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of an SOI substrate (10, 20, 30L) can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric layer 42L can be deposited conformally on all physically exposed sidewalls in the deep trench 42L and on the top surface of the upper pad layer 64L. The node dielectric layer 42L can include any dielectric material that can be employed as a node dielectric material in a capacitor known in the art. For example, the node dielectric layer 42L can include at least one of silicon nitride and a dielectric metal oxide material such as high dielectric constant (high-k) gate dielectric material as known in the art.

An inner electrode layer 44L can be deposited to completely fill the deep trench 45. The inner electrode layer 44L includes a conductive material, which can be a metallic material and/or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode layer 44L can be deposited by physical vapor deposition (PVD), chemical vapor deposition (CVD), electroplating, electroless plating, or a combination thereof. The inner electrode layer 44L is deposited to a thickness that is sufficient to completely fill the deep trench 45.

Figure 3A:
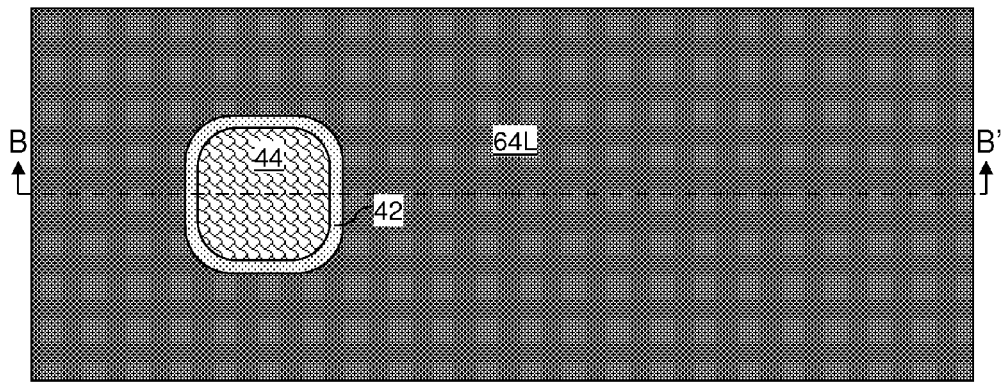
FIG. 3A is a top-down view of the first exemplary semiconductor structure after recessing the inner electrode layer and removal of exposed portions of the node dielectric layer according to the first embodiment of the present disclosure.
Figure 3B:
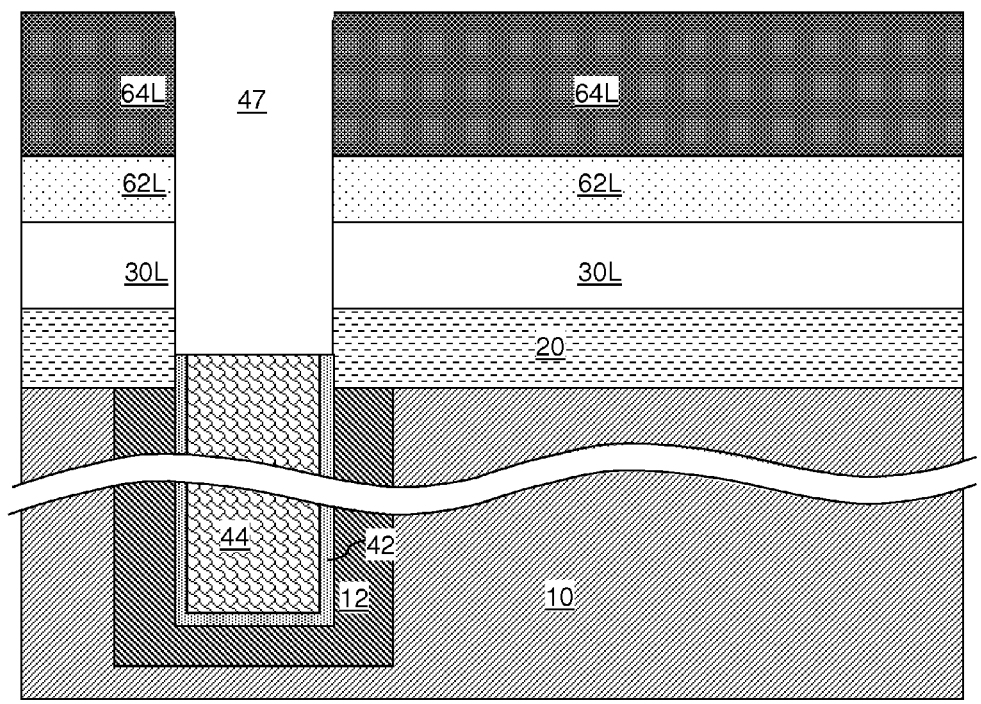
FIG. 3B is a vertical cross-sectional view of the first exemplary semiconductor structure along the vertical plane B-B' of FIG. 3A.

Referring to FIGS. 3A and 3B, the inner electrode layer 44L can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric layer 42L.

An inner electrode 44 including the conductive material of the inner electrode layer 44L is formed in the deep trench 45. The topmost surface of the inner electrode 44 is substantially planar, and is located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A cavity 47 is formed above the inner electrode 44.

The physically exposed portions of the node dielectric layer 42L can be patterned by an etch, which can be a wet etch. For example, if the node dielectric layer 42L includes silicon nitride, the physically exposed portions of the node dielectric layer 42L can be removed by a wet etch employing hot phosphoric acid. The remaining portion of the node dielectric layer 42L within the deep trench 45 constitutes a node dielectric 42. The set of the buried plate 12, the node dielectric 42, and the inner electrode 44 constitute a trench capacitor (12, 42, 44). The buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the SOI substrate (10, 12, 20, 30L). The buried insulator layer 20 overlies the buried plate 12 (i.e., the outer electrode).

Figure 4A:
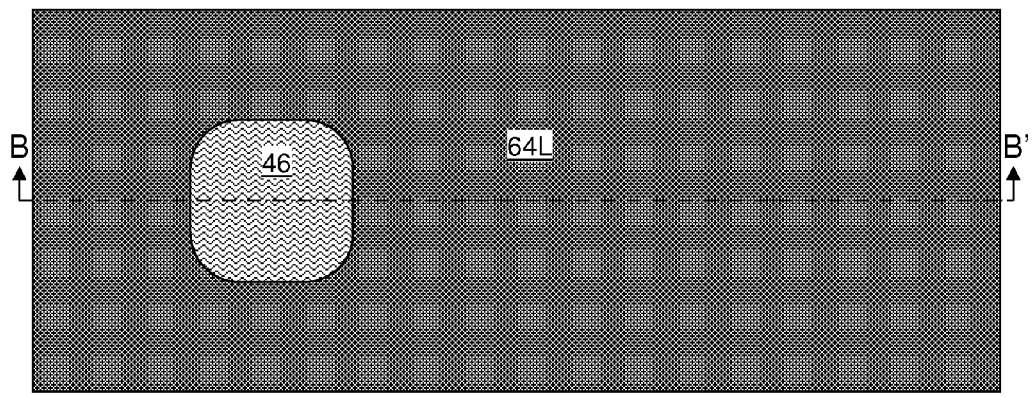
FIG. 4A is a top-down view of the first exemplary semiconductor structure after formation of a conductive strap structure according to the first embodiment of the present disclosure.
Figure 4B:
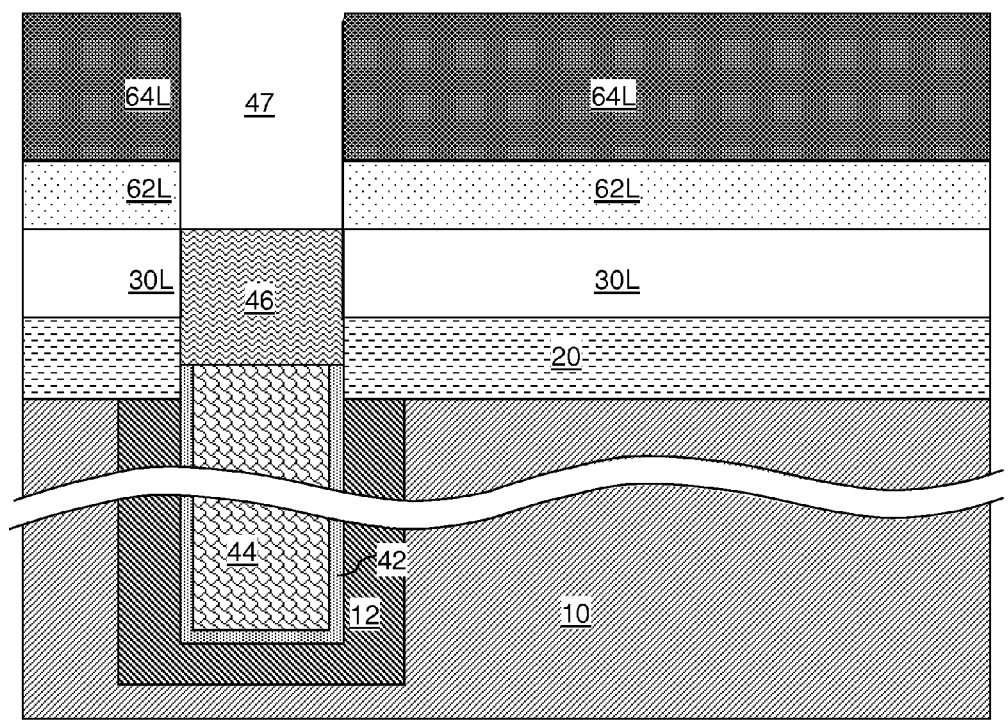
FIG. 4B is a vertical cross-sectional view of the first exemplary semiconductor structure along the vertical plane B-B' of FIG. 4A.

Referring to FIGS. 4A and 4B, a conductive strap structure 46 can be formed, for example, by depositing a conductive material within the cavity 47 and above the at least one pad layer (62L, 64L), and subsequently recessing the conductive material. Specifically, the conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to completely fill the cavity 47 as illustrated in FIGS. 3A and 3B.

The conductive material can be planarized, for example, by chemical mechanical planarization (CMP) employing the upper pad layer 54L as a stopping layer. Subsequently, the conductive material is recessed to a depth between the top surface of the lower pad layer 62L and the bottom surface of the top semiconductor layer 30L to form the conductive strap structure 46. In one embodiment, the top surface of the conductive strap structure 46 can be located at or above the top surface of the top semiconductor layer 30L. The conductive strap structure 46 can include the same material as, or a material different from, the inner electrode 44. A cavity 47 is formed above the conductive strap structure 46. The conductive strap structure 46 is in contact with, and overlies, the inner electrode 44.

Figure 5A:
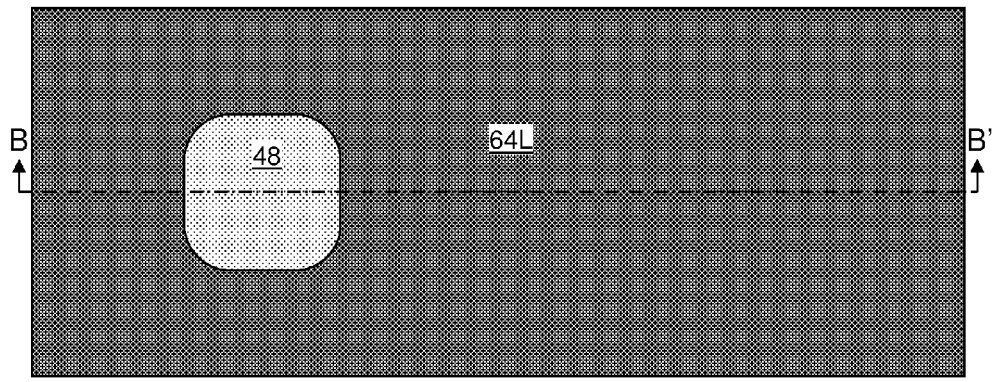
FIG. 5A is a top-down view of the first exemplary semiconductor structure after formation of a dielectric capacitor cap according to the first embodiment of the present disclosure.
Figure 5B:
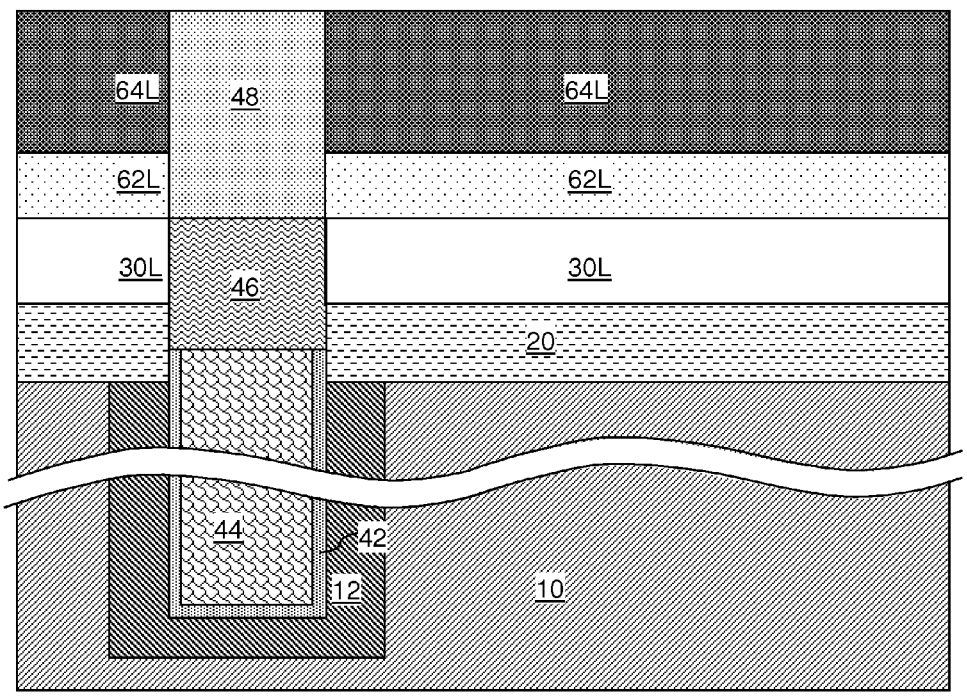
FIG. 5B is a vertical cross-sectional view of the first exemplary semiconductor structure along the vertical plane B-B' of FIG. 5A.

Referring to FIGS. 5A and 5B, a dielectric material can be deposited within the cavity 47 and above the at least one pad layer (62L, 64L), and can be subsequently planarized employing the upper pad layer 64L as a stopping layer to form a dielectric capacitor cap 48. The dielectric material of the dielectric capacitor cap 48 is different from the dielectric material of the upper pad layer 64L. For example, the dielectric material of the upper pad layer 64L can be silicon nitride, and dielectric material of the dielectric capacitor cap 48 can be silicon oxide. The dielectric material of the dielectric capacitor cap 48 can be deposited, for example, by chemical vapor deposition (CVD).

The dielectric capacitor cap 48 can be formed within an opening in the stack of the lower pad layer 62L and the upper pad layer 64L. The dielectric capacitor cap 48 contacts the top surface of the conductive strap structure 46. Specifically, the entirety of the bottom surface of the dielectric capacitor cap 48 is planar, and coincides with the entirety of the top surface of the conductive strap structure 46. Further, the entirety of sidewalls of the dielectric capacitor cap 48 is vertically coincident with the entirety of sidewalls of the conductive strap structure 46.

Figure 6A:
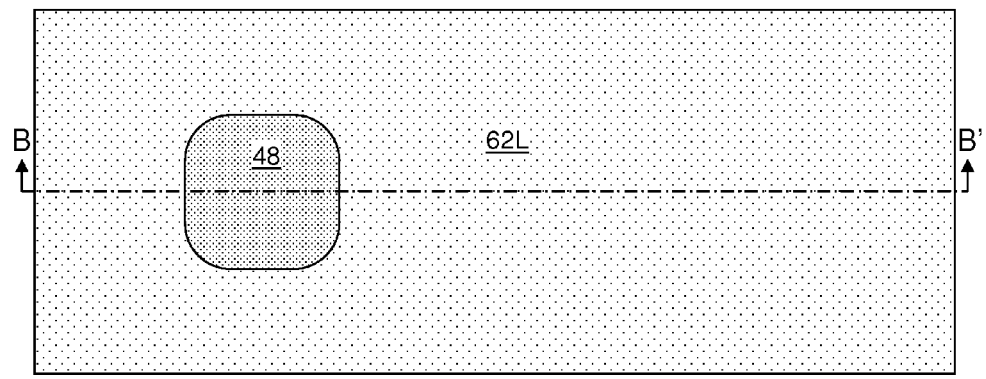
FIG. 6A is a top-down view of the first exemplary semiconductor structure after removal of an upper pad layer according to the first embodiment of the present disclosure.
Figure 6B:
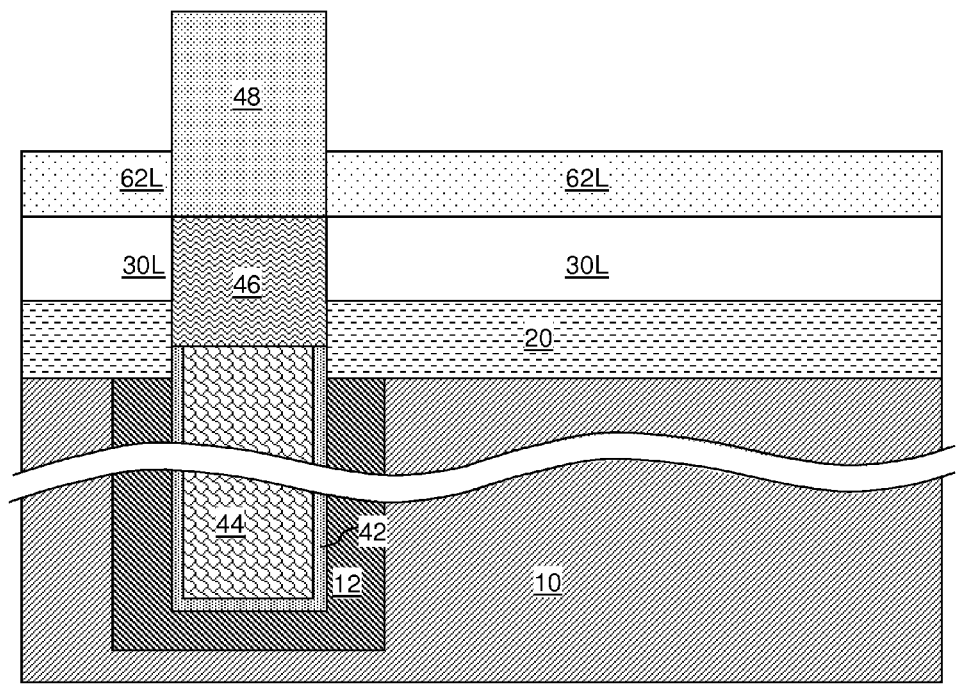
FIG. 6B is a vertical cross-sectional view of the first exemplary semiconductor structure along the vertical plane B-B' of FIG. 6A.

Referring to FIGS. 6A and 6B, the upper pad layer 64L can be removed, for example, by a wet etch selective to the dielectric capacitor cap 48 and the lower pad layer 62L. In one embodiment, the upper pad layer 64L can include silicon nitride, the dielectric capacitor cap 48 includes silicon oxide, and the lower pad layer 62L can include silicon oxide or a dielectric metal oxide, and the removal of the upper pad layer 64L selective to the dielectric capacitor cap 48 and the lower pad layer 62L can be effected by a wet etch employing hot phosphoric acid.

Figure 7A:
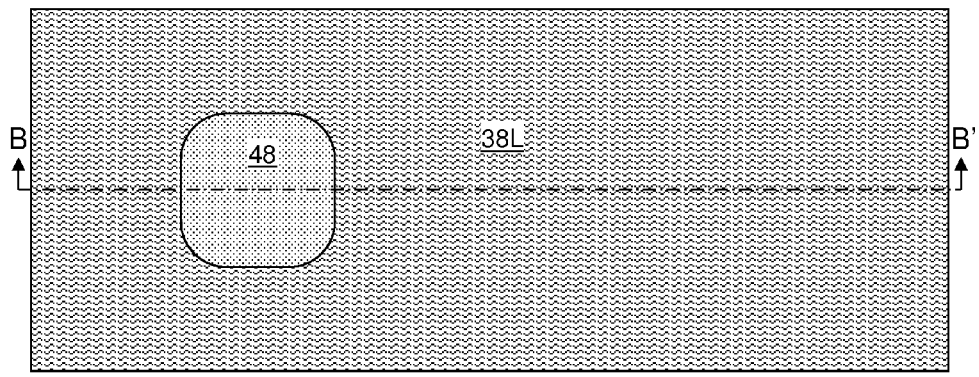
FIG. 7A is a top-down view of the first exemplary semiconductor structure after formation of a mask material layer according to the first embodiment of the present disclosure.
Figure 7B:
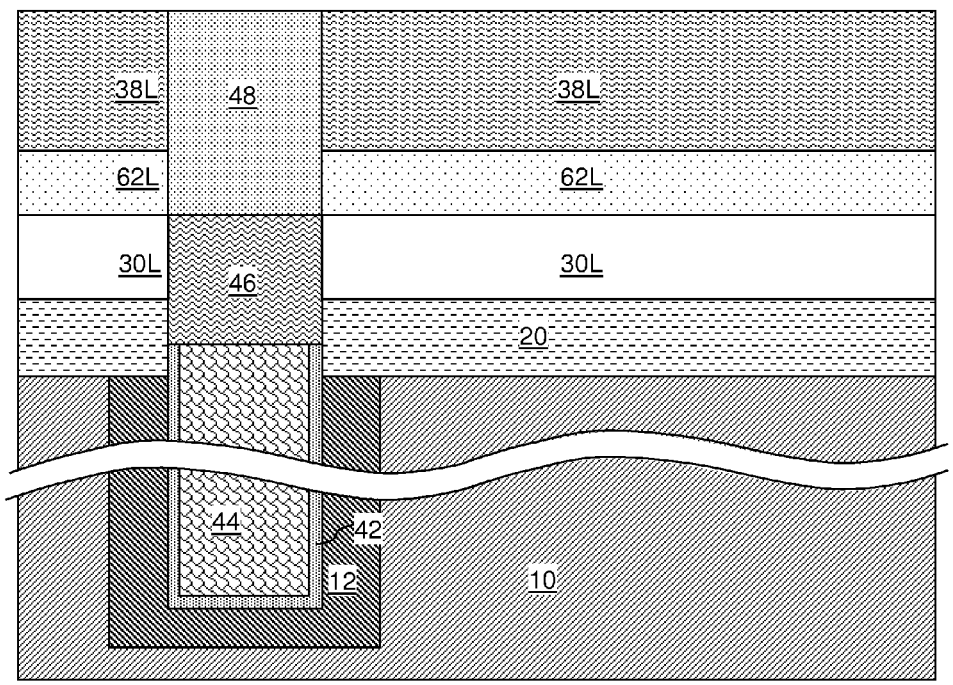
FIG. 7B is a vertical cross-sectional view of the first exemplary semiconductor structure along the vertical plane B-B' of FIG. 7A.
Figure 8B:
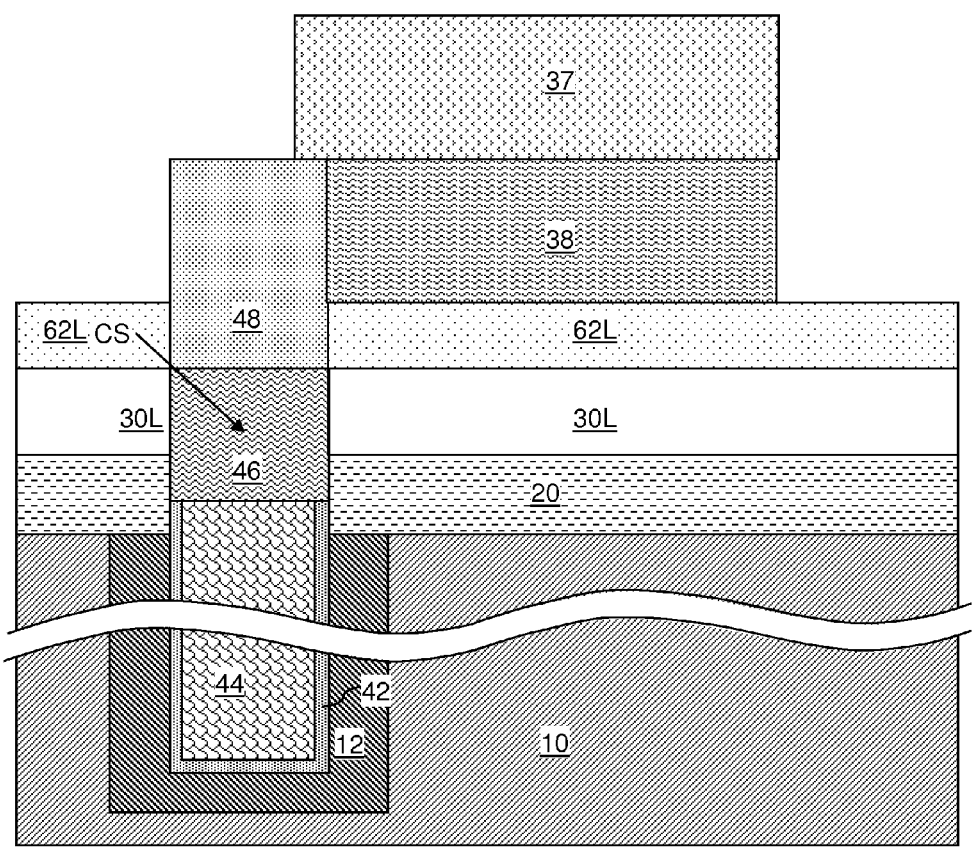
FIG. 8B is a vertical cross-sectional view of the first exemplary semiconductor structure along the vertical plane B-B' of FIG. 8A.
Figure 8C:
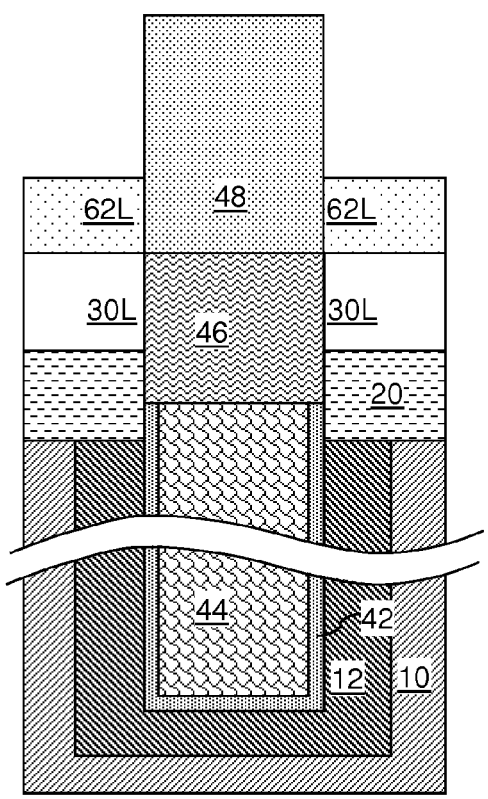
FIG. 8C is a vertical cross-sectional view of the first exemplary semiconductor structure along the vertical plane C-C' of FIG. 8A.
Figure 8E:
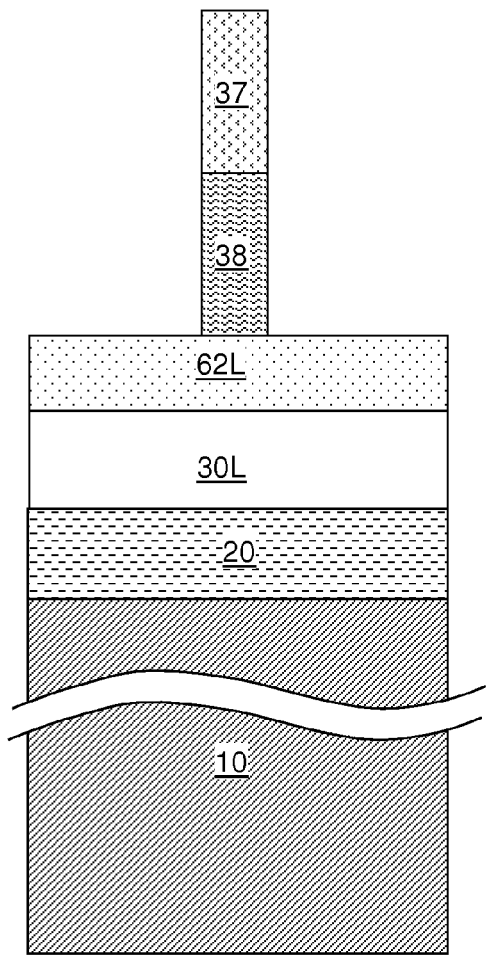
FIG. 8E is a vertical cross-sectional view of the first exemplary semiconductor structure along the vertical plane E-E' of FIG. 8A.
Figure 8D:
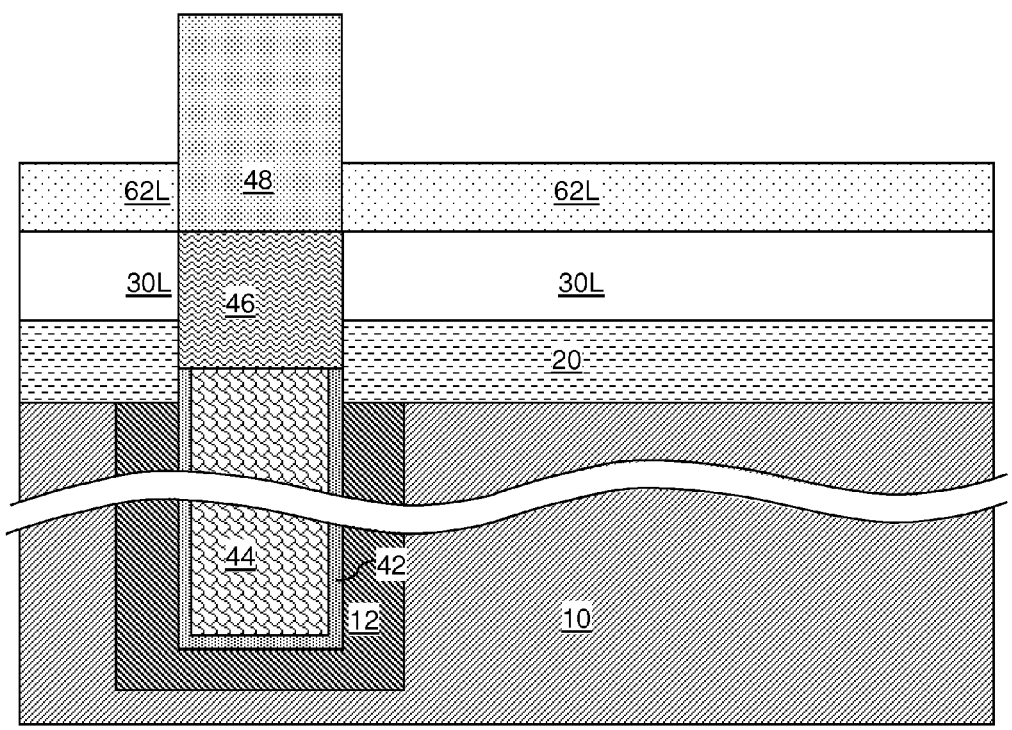
FIG. 8D is a vertical cross-sectional view of the first exemplary semiconductor structure along the vertical plane D-D' of FIG. 8A.
Figure 9A:
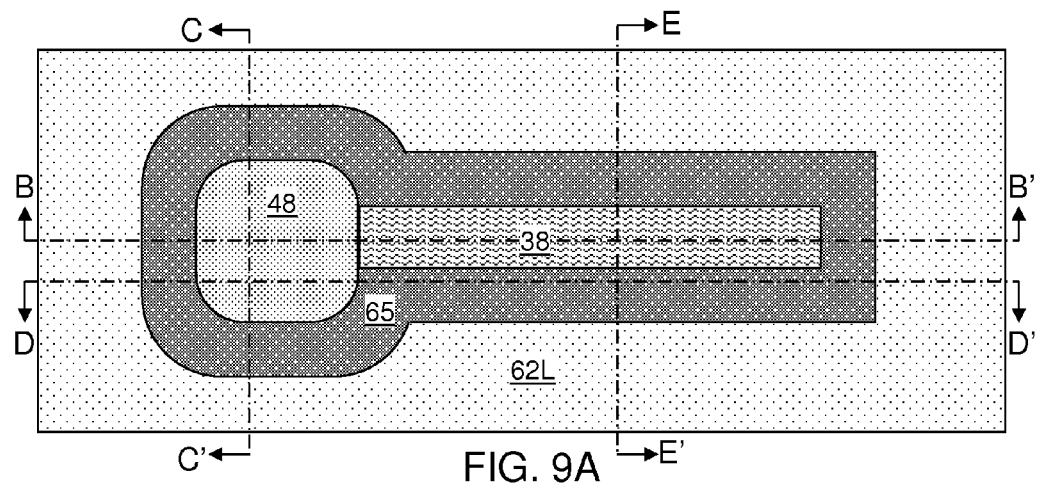
FIG. 9A is a top-down view of the first exemplary semiconductor structure after formation of a fin-defining spacer according to the first embodiment of the present disclosure.
Figure 9B:
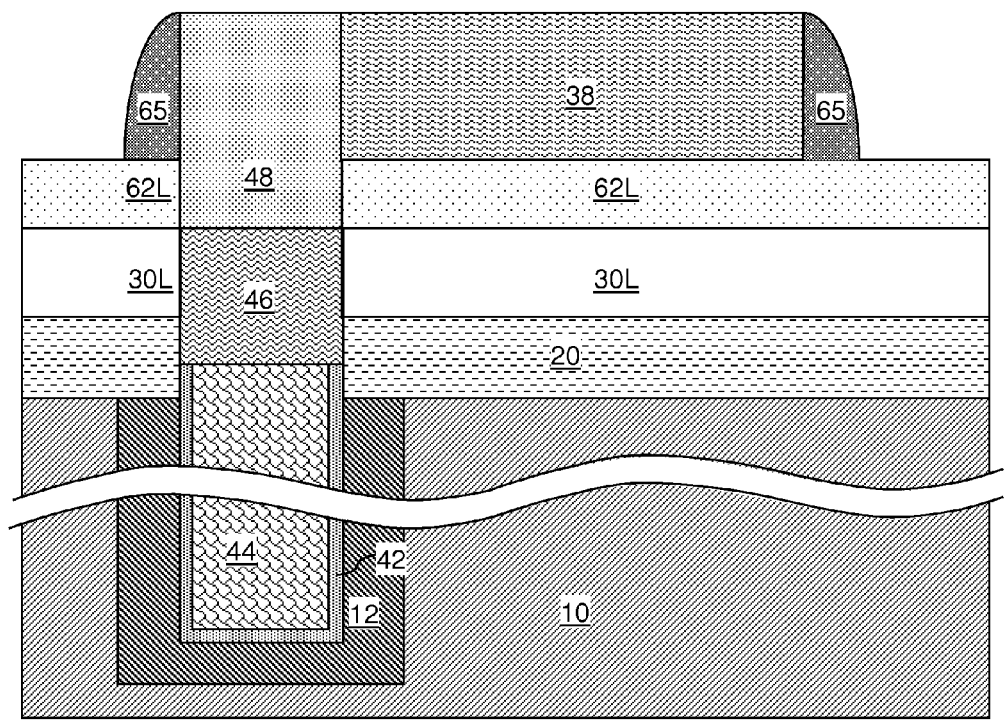
FIG. 9B is a vertical cross-sectional view of the first exemplary semiconductor structure along the vertical plane B-B' of FIG. 9A.
Figure 9D:
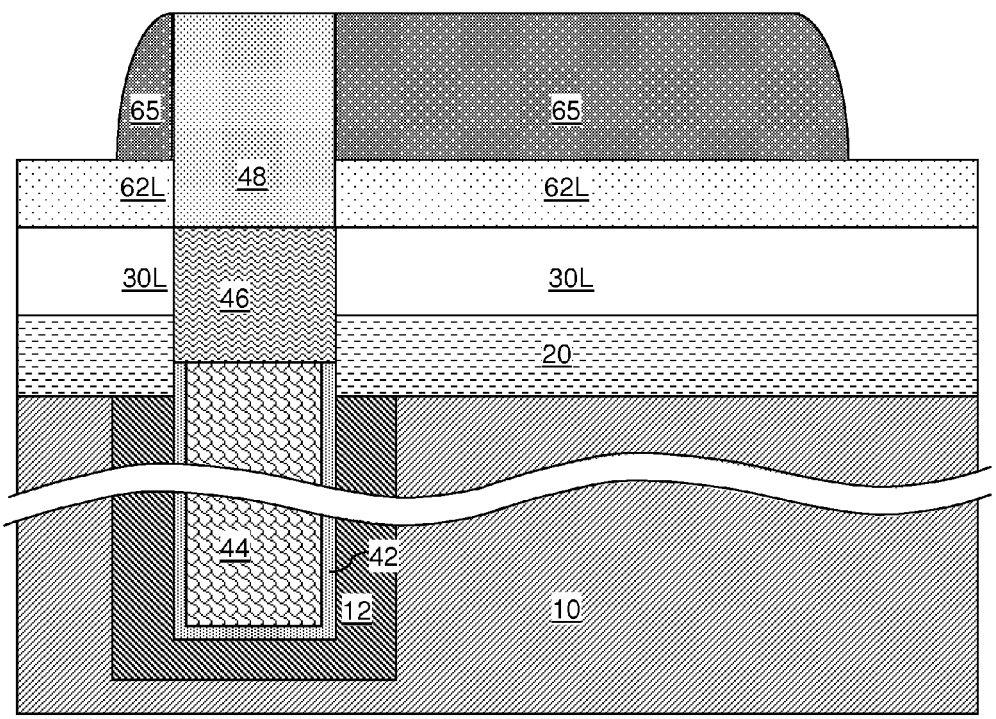
FIG. 9D is a vertical cross-sectional view of the first exemplary semiconductor structure along the vertical plane D-D' of FIG. 9A.
Figure 10A:
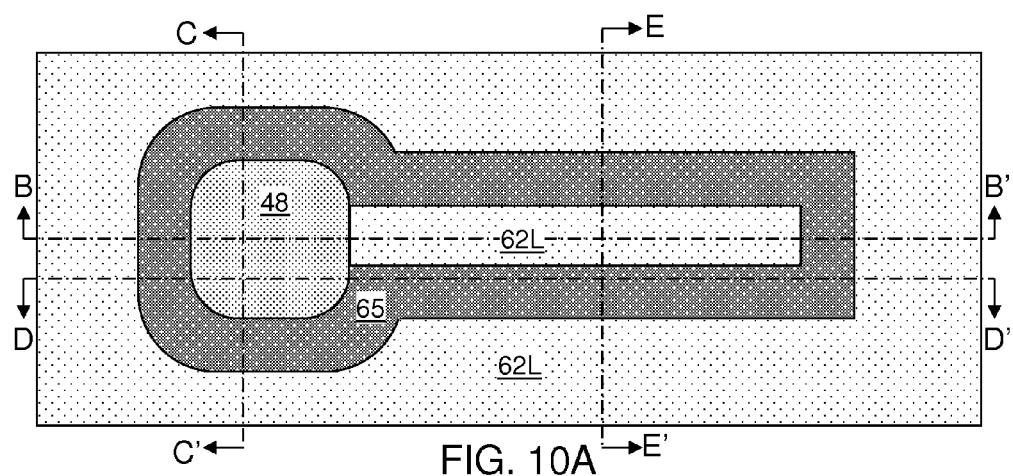
FIG. 10A is a top-down view of the first exemplary semiconductor structure after removal of the mask material portion according to the first embodiment of the present disclosure.
Figure 10B:
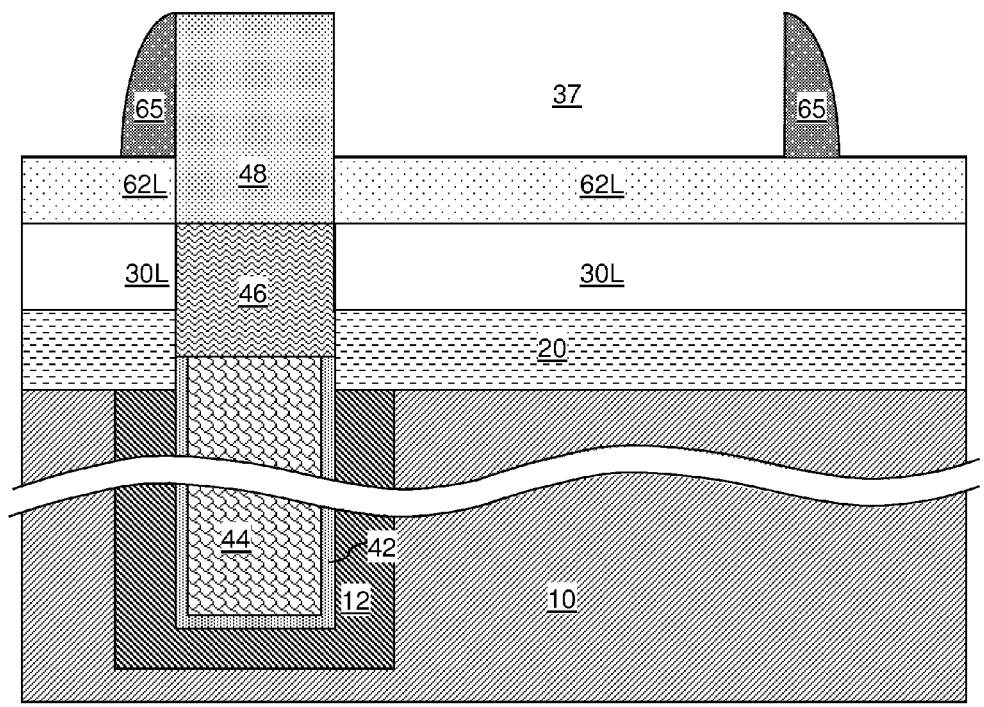
FIG. 10B is a vertical cross-sectional view of the first exemplary semiconductor structure along the vertical plane B-B' of FIG. 10A.
Figure 10C:
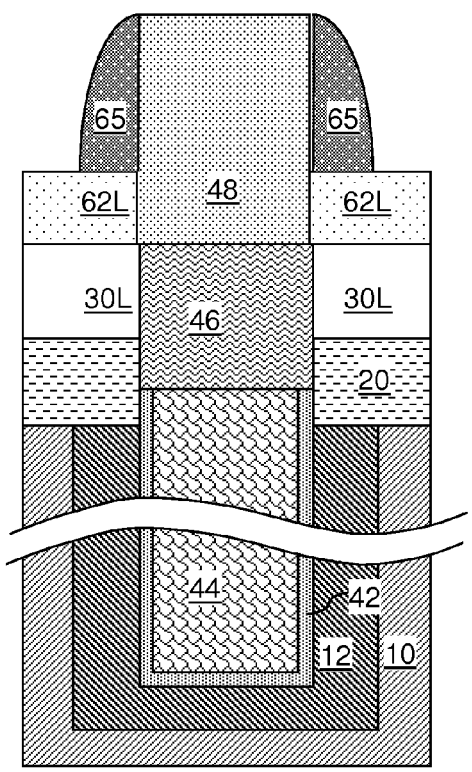
FIG. 10C is a vertical cross-sectional view of the first exemplary semiconductor structure along the vertical plane C-C' of FIG. 10A.
Figure 10E:
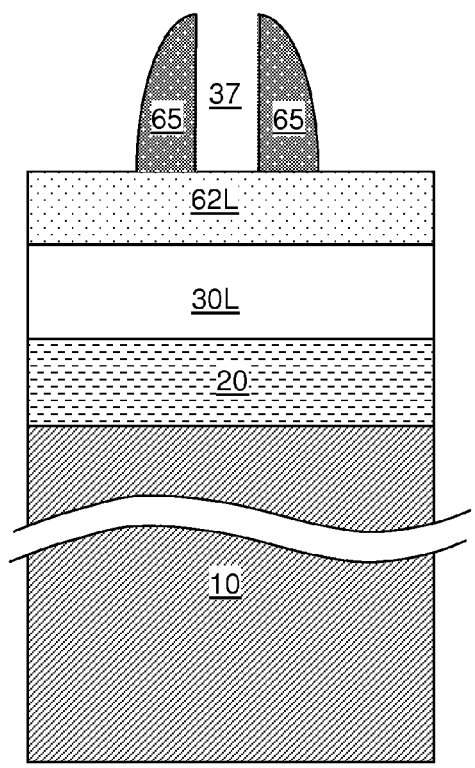
FIG. 10E is a vertical cross-sectional view of the first exemplary semiconductor structure along the vertical plane E-E' of FIG. 10A.
Figure 10D:
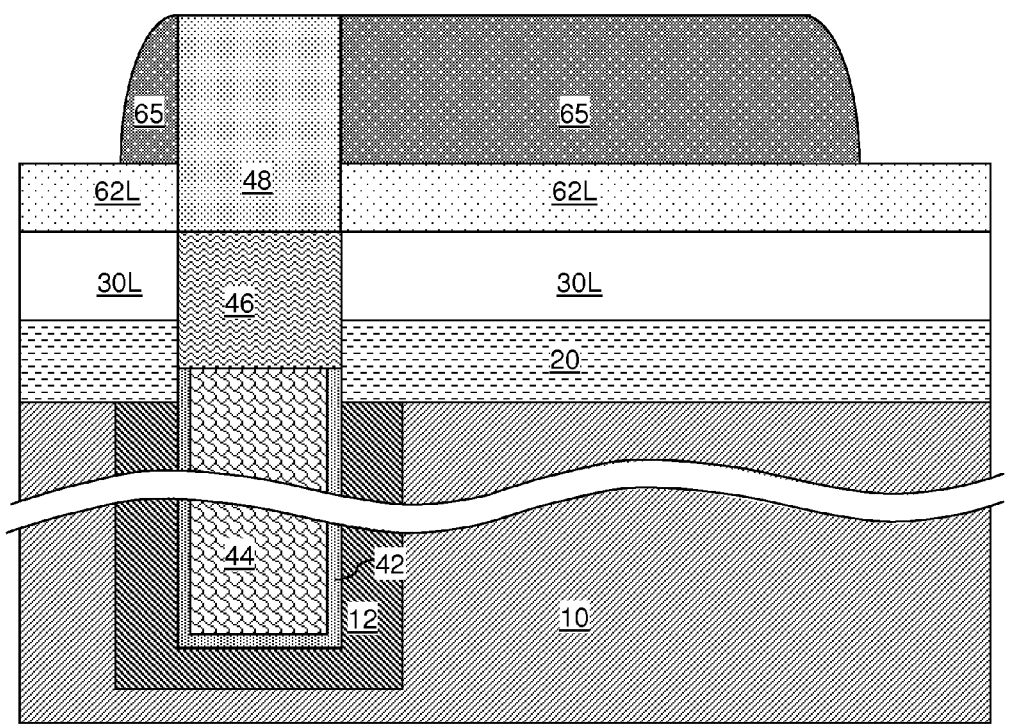
FIG. 10D is a vertical cross-sectional view of the first exemplary semiconductor structure along the vertical plane D-D' of FIG. 10A.
Figure 11A:
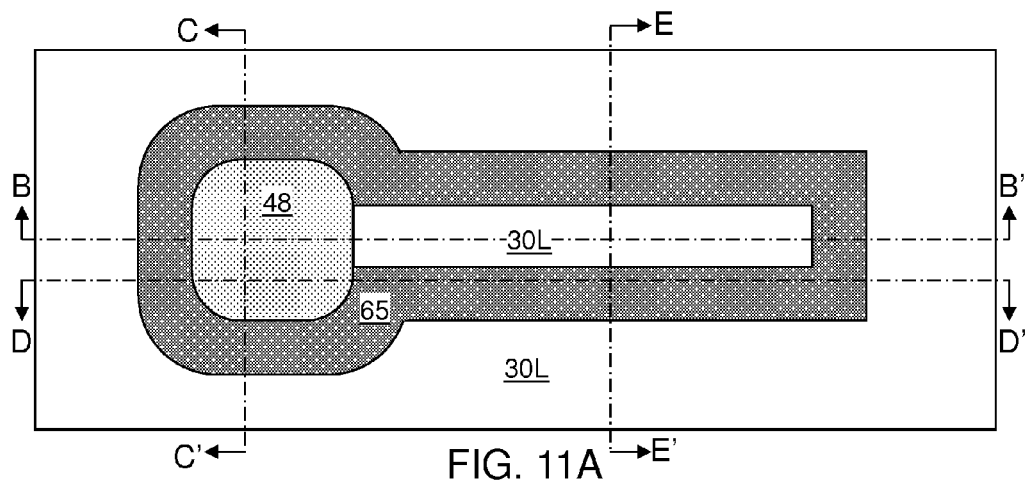
FIG. 11A is a top-down view of the first exemplary semiconductor structure after patterning of a lower pad layer according to the first embodiment of the present disclosure.
Figure 11B:
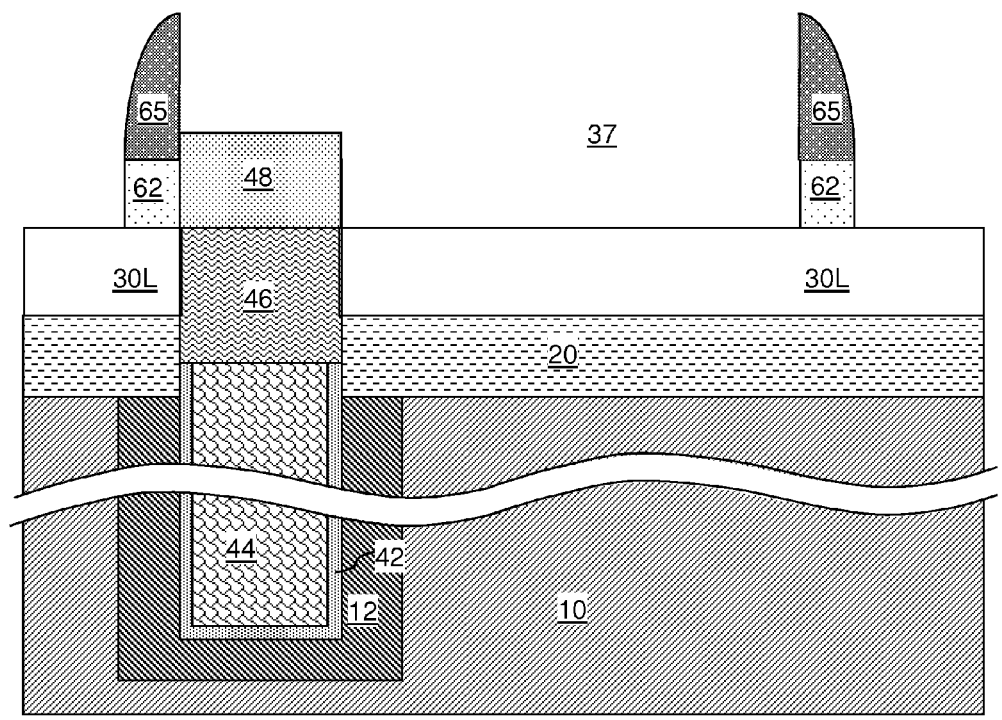
FIG. 11B is a vertical cross-sectional view of the first exemplary semiconductor structure along the vertical plane B-B' of FIG. 11A.
Figure 11C:
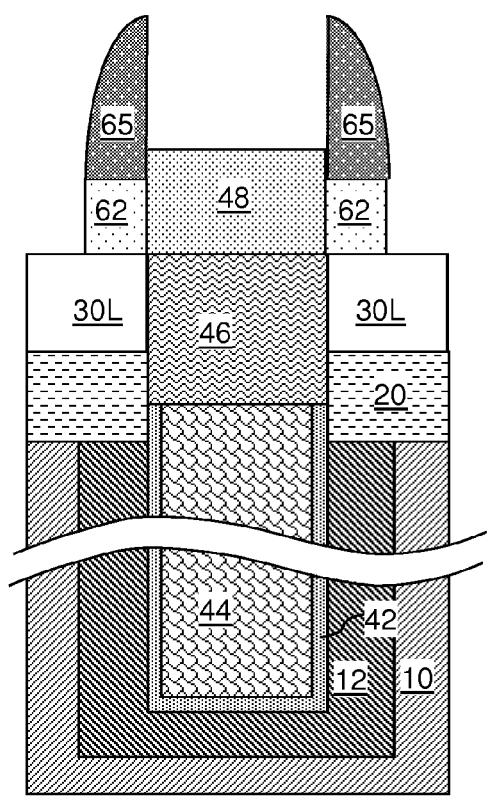
FIG. 11C is a vertical cross-sectional view of the first exemplary semiconductor structure along the vertical plane C-C' of FIG. 11A.
Figure 11E:
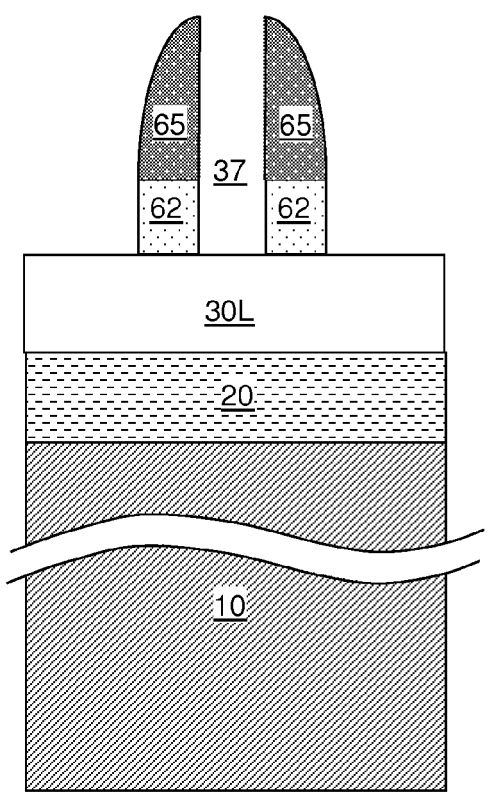
FIG. 11E is a vertical cross-sectional view of the first exemplary semiconductor structure along the vertical plane E-E' of FIG. 11A.
Figure 11D:
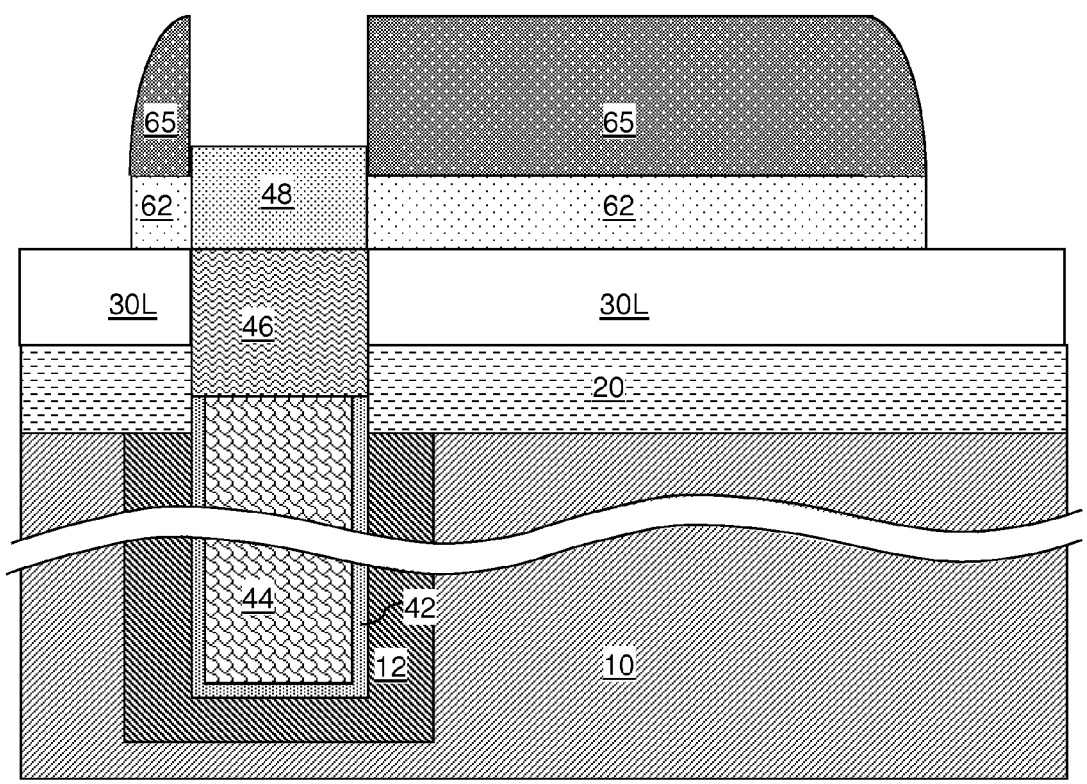
FIG. 11D is a vertical cross-sectional view of the first exemplary semiconductor structure along the vertical plane D-D' of FIG. 11A.
Figure 12A:
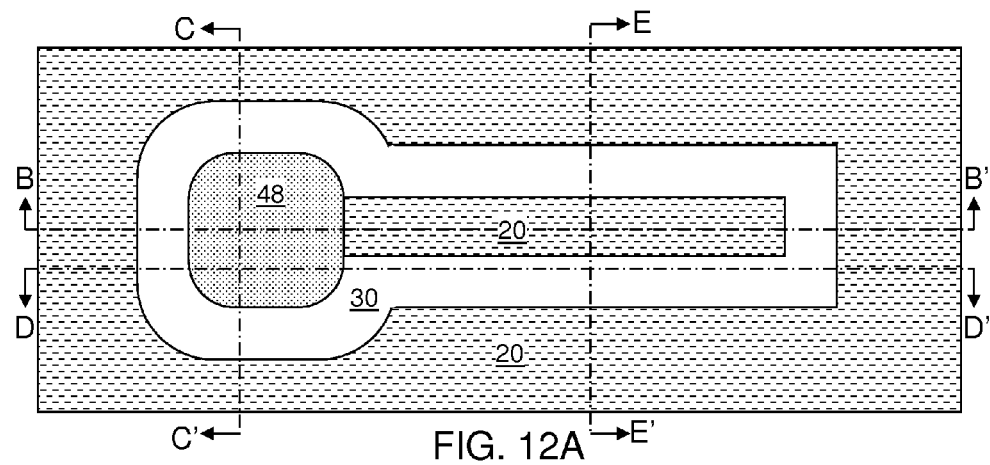
FIG. 12A is a top-down view of the first exemplary semiconductor structure after formation of a semiconductor fin according to the first embodiment of the present disclosure.
Figure 12B:
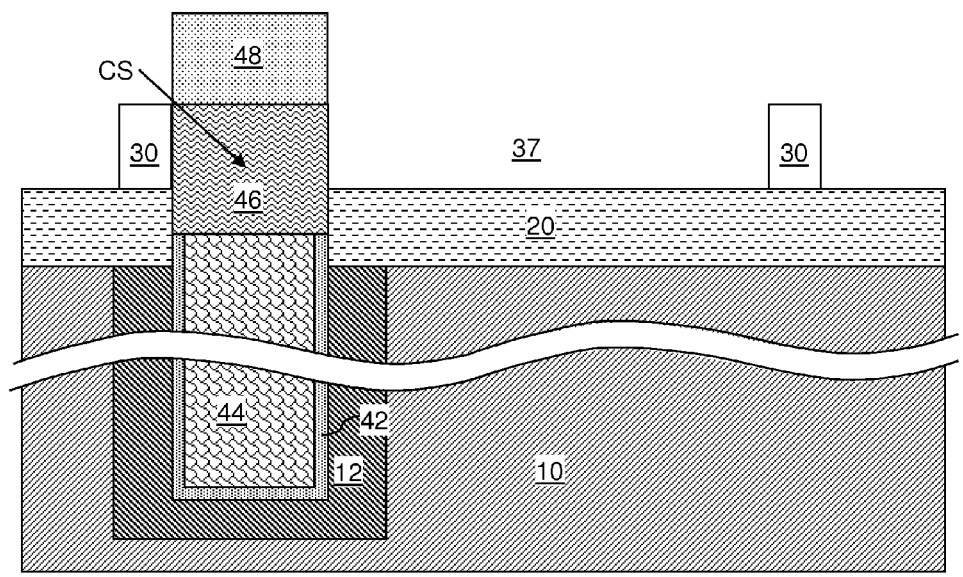
FIG. 12B is a vertical cross-sectional view of the first exemplary semiconductor structure along the vertical plane B-B' of FIG. 12A.
Figure 12C:
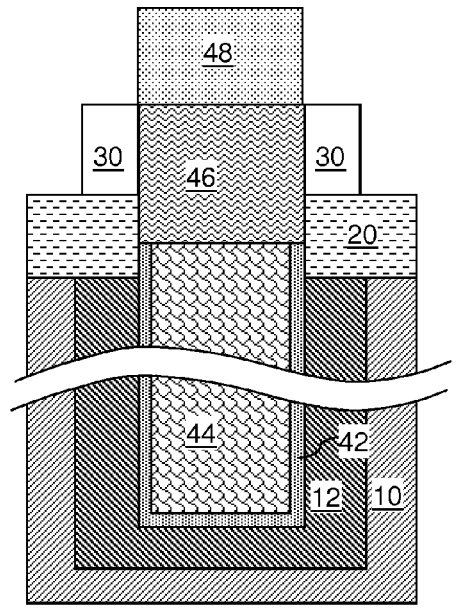
FIG. 12C is a vertical cross-sectional view of the first exemplary semiconductor structure along the vertical plane C-C' of FIG. 12A.
Figure 12E:
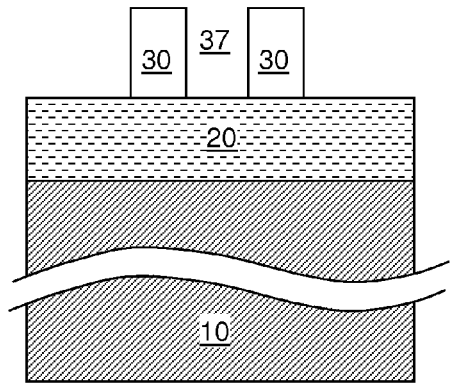
FIG. 12E is a vertical cross-sectional view of the first exemplary semiconductor structure along the vertical plane E-E' of FIG. 12A.
Figure 12D:
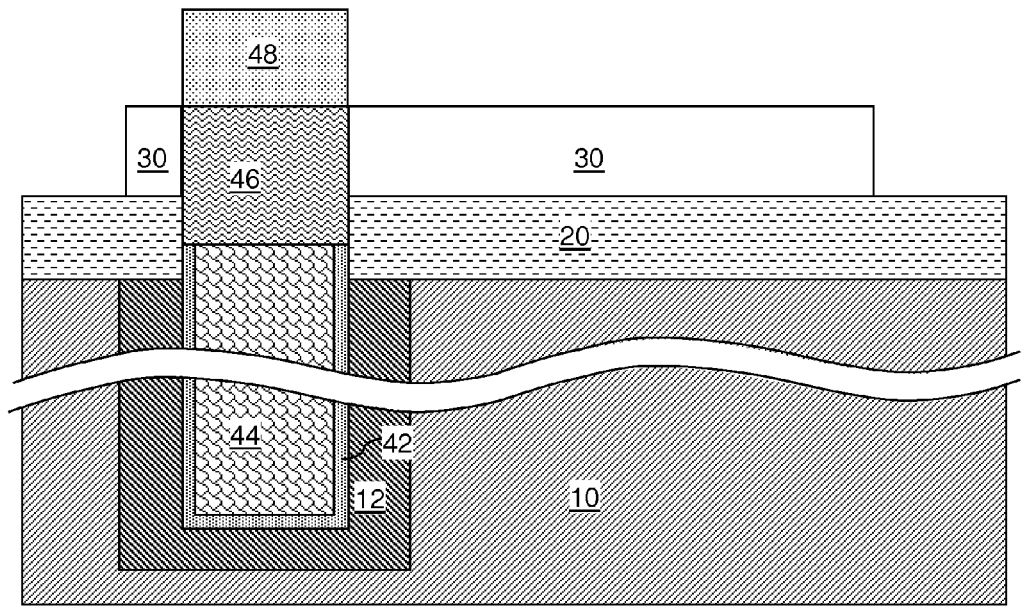
FIG. 12D is a vertical cross-sectional view of the first exemplary semiconductor structure along the vertical plane D-D' of FIG. 12A.
Figure 13A:
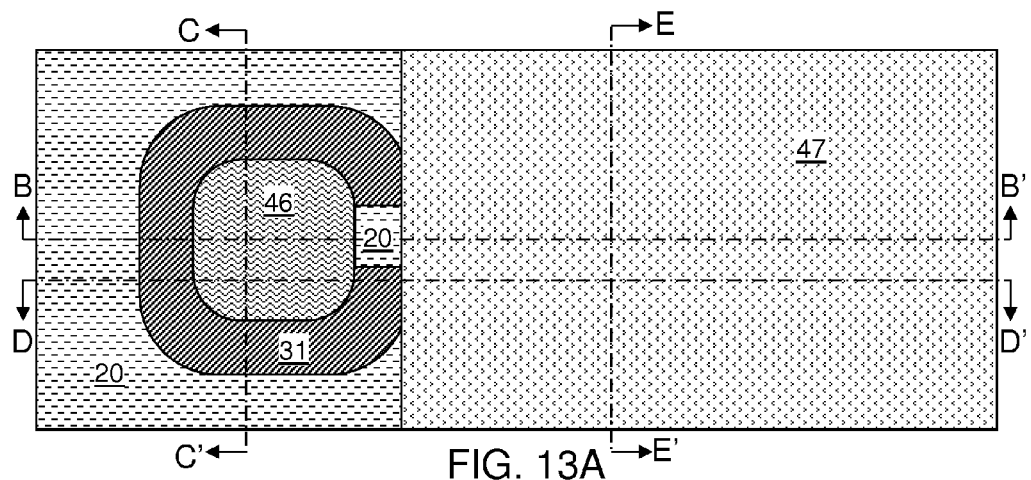
FIG. 13A is a top-down view of the first exemplary semiconductor structure after doping of a warp-around portion of the semiconductor fin according to the first embodiment of the present disclosure.
Figure 13B:
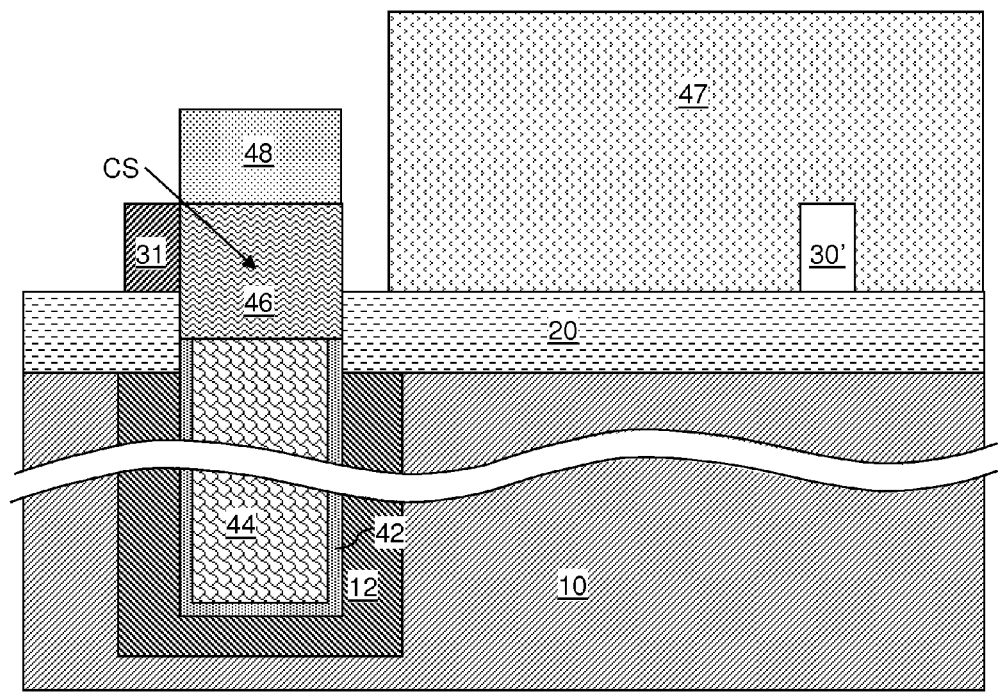
FIG. 13B is a vertical cross-sectional view of the first exemplary semiconductor structure along the vertical plane B-B' of FIG. 13A.
Figure 13D:
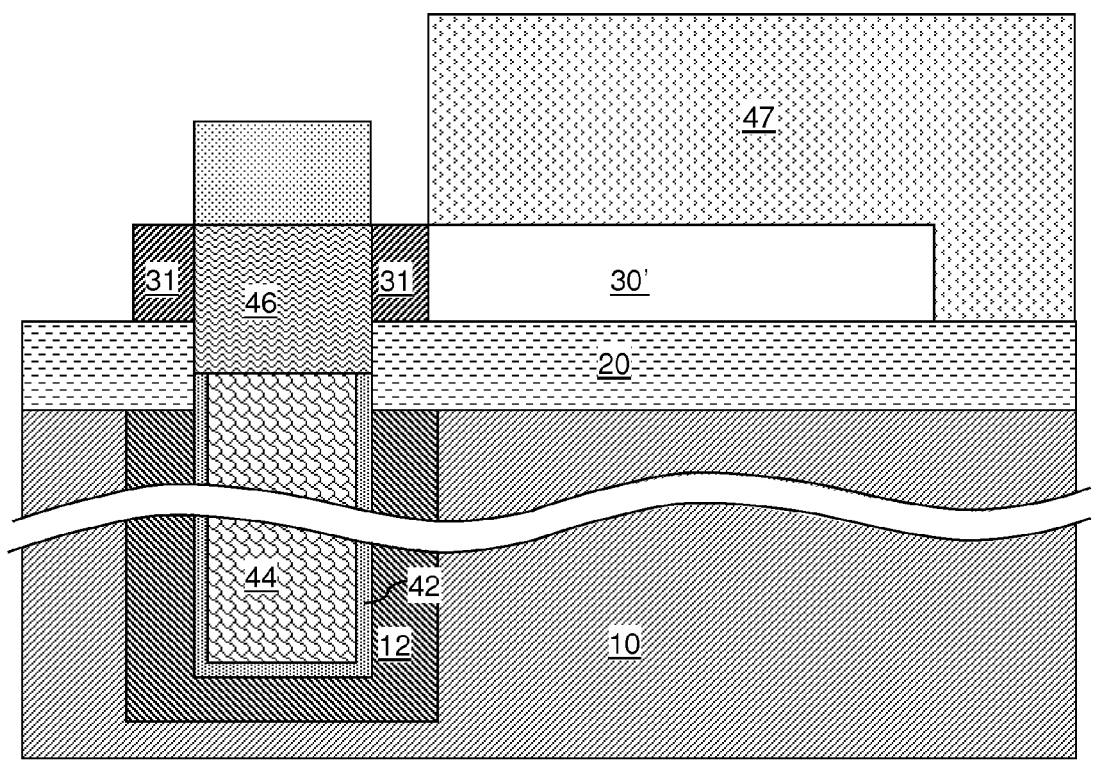
FIG. 13D is a vertical cross-sectional view of the first exemplary semiconductor structure along the vertical plane D-D' of FIG. 13A.
Figure 14A:
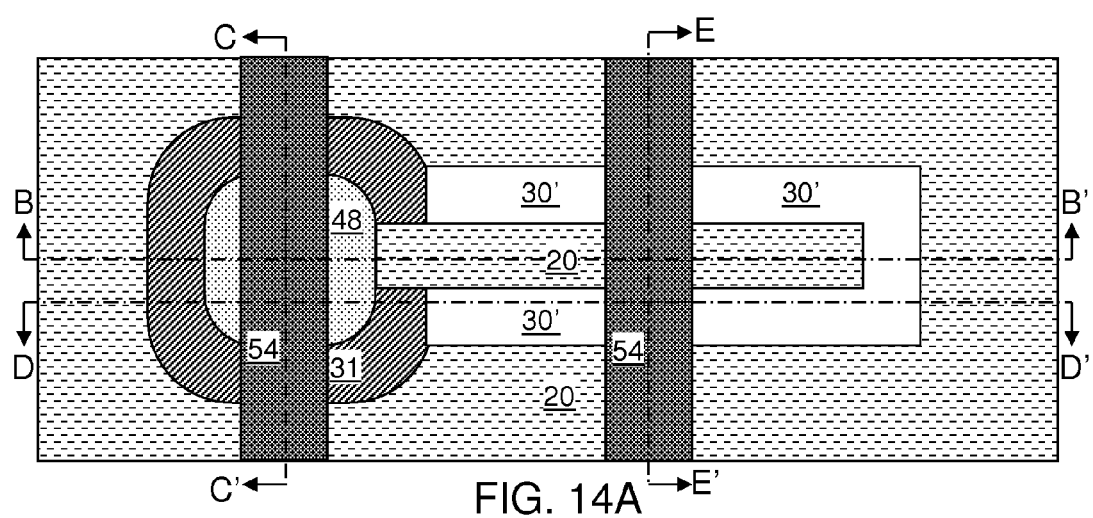
FIG. 14A is a top-down view of the first exemplary semiconductor structure after formation of gate dielectrics and gate electrodes according to the first embodiment of the present disclosure.
Figure 14B:
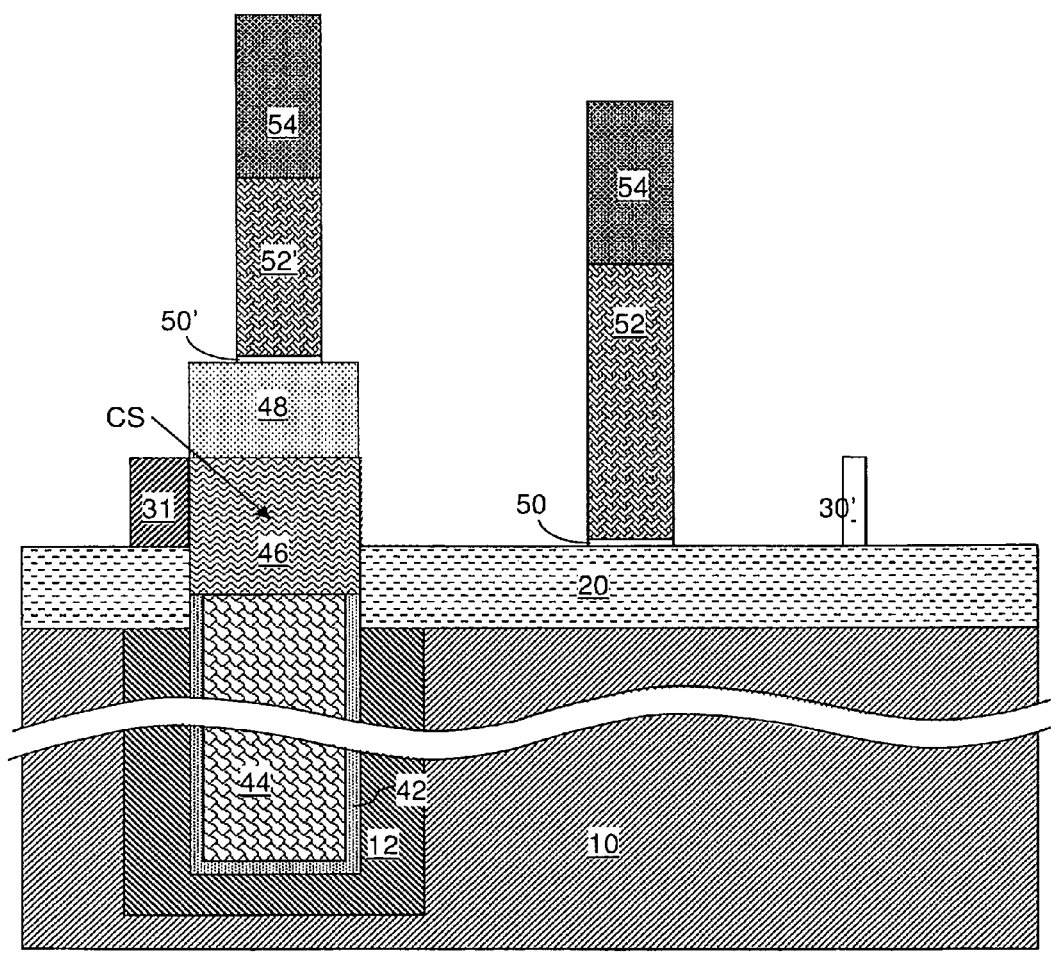
FIG. 14B is a vertical cross-sectional view of the first exemplary semiconductor structure along the vertical plane B-B' of FIG. 14A.
Figure 14C:
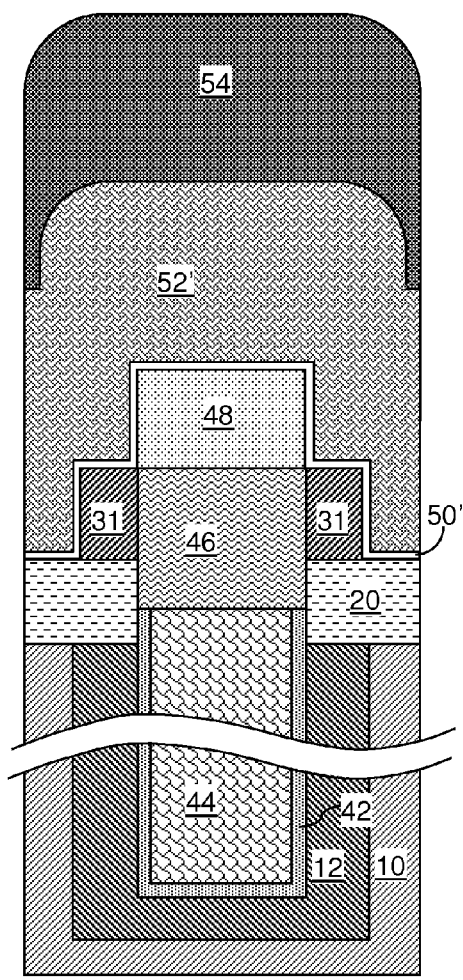
FIG. 14C is a vertical cross-sectional view of the first exemplary semiconductor structure along the vertical plane C-C' of FIG. 14A.
Figure 14E:
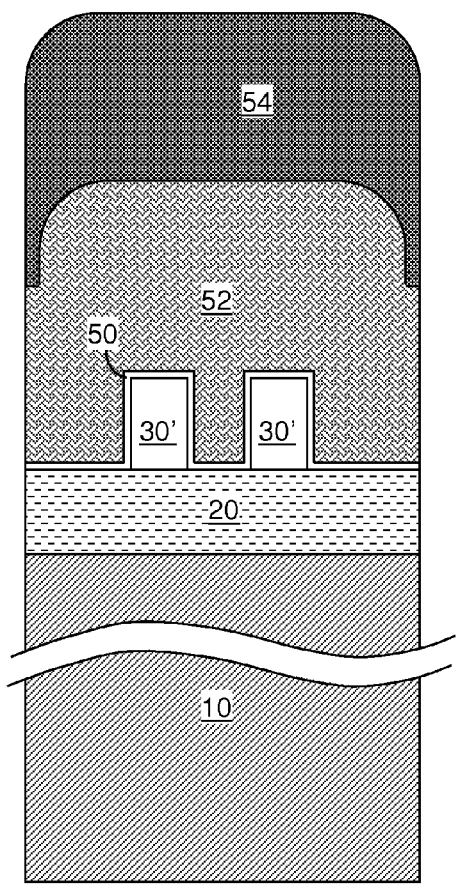
FIG. 14E is a vertical cross-sectional view of the first exemplary semiconductor structure along the vertical plane E-E' of FIG. 14A.
Figure 14D:
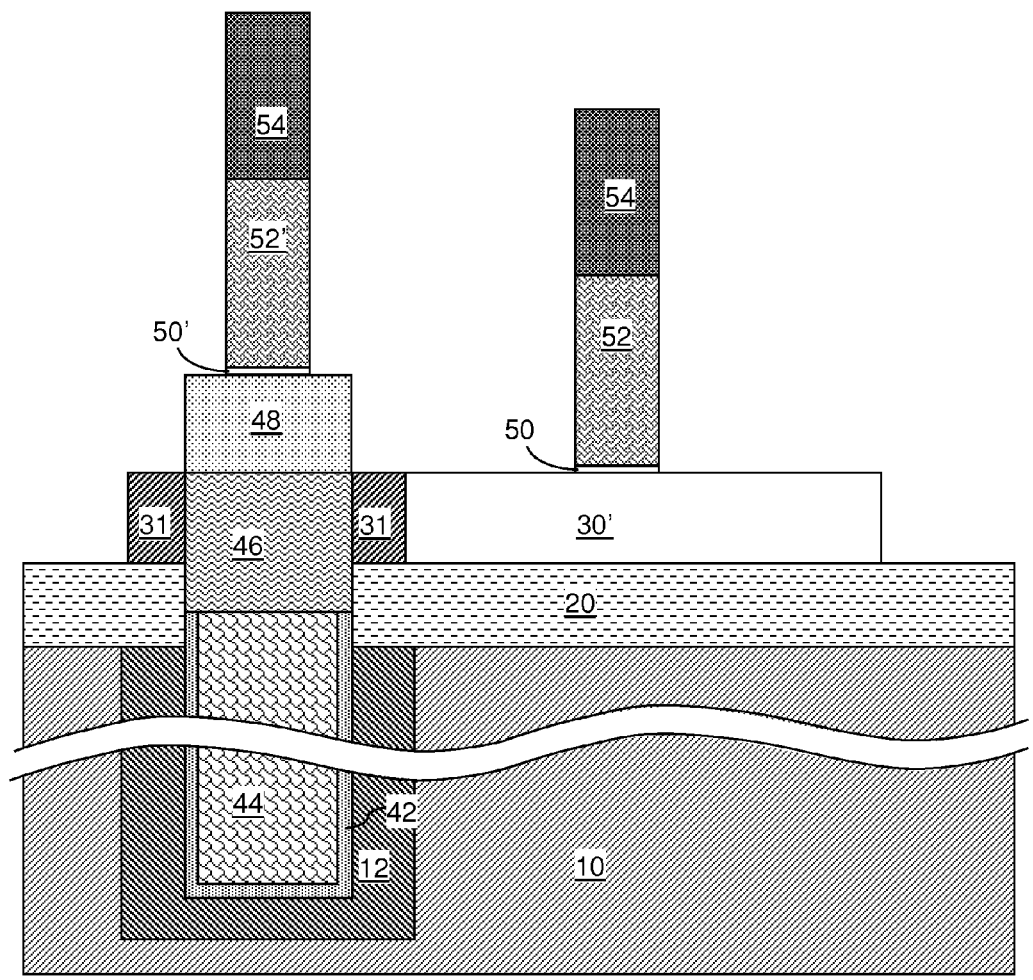
FIG. 14D is a vertical cross-sectional view of the first exemplary semiconductor structure along the vertical plane D-D' of FIG. 14A.

Referring to FIGS. 7A and 7B, a mask material layer 38L can be deposited, for example, by chemical vapor deposition (CVD), atomic layer deposition (ALD), or physical vapor deposition (PVD), and is subsequently planarized employing the dielectric capacitor cap 48 as a stopping layer. For example, the mask material layer 38L can be planarized by chemical mechanical planarization (CMP) such that a top surface of the remaining portion of the mask material layer 38L is coplanar with the top surface of the dielectric capacitor cap 48. The processing steps of FIGS. 6A, 6B, 7A, and 7B replace the upper pad layer 64L with the mask material layer 38L.

The mask material layer 38L includes a material that is different from the materials of the upper pad layer 64L, the lower pad layer 62L, and the dielectric capacitor cap 48. For example, the upper pad layer 64L can include silicon nitride, the dielectric capacitor cap 48 includes silicon oxide, and the lower pad layer 62L can include silicon oxide or a dielectric metal oxide, and the mask material layer 38L can include a semiconductor material, an organic material such as a polymer, or amorphous carbon.

Referring to FIGS. 8A-8E, a photoresist layer 37 can be applied over the mask material layer 38L and the dielectric capacitor cap 48, and can be lithographically patterned such that the remaining portion of the photoresist layer 37 overlies a portion of the top semiconductor layer 30L that adjoins the conductive strap structure 46. Thus, the remaining portion of the photoresist layer 37 overlies a sidewall of the dielectric capacitor cap 48. The pattern in the photoresist layer 37 is transferred into the mask material layer 38L by an anisotropic etch that removes the material of the mask material layer 38L selective to the material of the dielectric capacitor cap 48. The remaining portion of the mask material layer 38L is herein referred to as a mask material portion 38. The mask material portion 38 is in lateral contact with the dielectric capacitor cap 48.

In one embodiment, the mask material portion 38 can have a set of parallel edges 37E such that a vertical plane located at a midpoint between the set of parallel edges 37E passes through, or close to, the geometrical center CS of the conductive strap structure 46. The geometrical center of the conductive strap structure 46 can be defined by a Cartesian coordinate (Xc, Yc, Zc), in which Xc, Yc, and Zc are given by:

$$X_C = \frac{\int x dV}{\int dV},$$

$$Y_C = \frac{\int y dV}{\int dV}, \text{ and}$$

$$Z_C = \frac{\int z dV}{\int dV},$$

in which each integration is performed over all volume elements dV within the volume of the conductive material structure 46.

The mask material portion 38 and the dielectric capacitor cap 48 collectively constitute a set (38, 48) of masking structures, which overlies the conductive strap structure 46 and a portion of the top semiconductor layer 30L. The photoresist layer 37 can be subsequently removed selective to the mask material portion 38 and the dielectric capacitor cap 48, by ashing or by a solvent.

Referring to FIGS. 9A-9E, a fin defining spacer 65 can be formed by deposition of a substantially conformal material layer and an anisotropic etch that removes horizontal portions of the substantially conformal material layer. The substantially conformal material layer includes a material that is different from the material of the lower pad layer 62L, the dielectric capacitor cap 48, and the mask material portion 38. The material of the substantially conformal material layer can be a dielectric material, a semiconductor material, or a metallic material. For example, the material of the substantially conformal material layer can be silicon nitride, a dielectric metal oxide, polysilicon, or a metallic material such as Ti, Ta, W, TiN, TaN, or WN. In one embodiment, the material of the substantially conformal material layer can be silicon nitride.

The substantially conformal material layer can be deposited, for example, by chemical vapor deposition (CVD). The thickness of the substantially conformal material layer, which is substantially the same as the thickness of the fin-defining spacer 65 as measured at the base, can be from 5 nm to 100 nm, although lesser and greater thicknesses can also be employed. In one embodiment, the thickness of the substantially conformal material layer can be from 10 nm to 50 nm.

The fin-defining spacer 65 can be formed on the sidewalls of the set (38, 48) of masking structures, and may be formed as a structure that is topologically homeomorphic to a torus, i.e., a structure that can be contiguously deformed into a torus without creating or destroying a singularity (such as a hole within a plane). The fin-defining spacer 65 laterally surrounds the set (38, 48) of masking structures.

Referring to FIGS. 10A-10E, the mask material portion 38 can be removed selective to the fin-defining spacer 65, the dielectric capacitor cap 48, and the lower pad layer 62L. The removal of the mask material portion 38 can be effected, for example, by a wet etch, by an anisotropic etch such as a reactive ion etch, or by ashing. A trough 37 surrounded by the inner sidewalls of the fin-defining spacer 65 and a sidewall of the dielectric capacitor cap 48 is formed in a volume from which the mask material portion 38 is removed.

Referring to FIGS. 11A-11E, the pattern in the fin-defining spacer 65 can be transferred into the lower pad layer 62L by an anisotropic etch that employs the fin-defining spacer 65 as an etch mask. The remaining portion of the lower pad layer 62L constitutes a lower pad portion 62 having a same horizontal cross-sectional area as the area of the base of the fin-defining spacer 65. The top surface of the dielectric capacitor cap 48 can be recessed during the anisotropic etch that patterns the lower pad layer 62L.

Referring to FIGS. 12A-12E, the pattern of the fin-defining spacer 65 can be transferred into the top semiconductor layer 30L. The top semiconductor layer 30L can be etched employing, as an etch mask, at least one of the fin-defining spacer 65 and the lower pad portion 62, i.e., the remaining portion of the lower pad layer after the etching of the lower pad layer 62L at the processing step of FIGS. 11A-11E. The remaining portion of the top semiconductor layer 30L constitutes a semiconductor fin 30 having a uniform width throughout. The width of the semiconductor fin 30 can be substantially the same as the width of the base of the fin-defining spacer 65. Further, the horizontal area of the semiconductor fin 30 is the same as the area of the base of the fin-defining spacer 65.

In one embodiment, the fin-defining spacer 65 can be employed as the etch mask during the etching of the top semiconductor layer 30L. Upon formation of the semiconductor fin 30, the fin-defining spacer 65 and the lower pad portion 62 can be removed selective to the semiconductor fin 30, for example, by a wet etch, a dry etch, or a combination thereof.

In another embodiment, the fin-defining spacer can be removed, for example, by a wet etch selective to the lower pad portion 62 and the top semiconductor layer 30L. The lower pad portion 62 is employed as the etch mask during the etching of the top semiconductor layer 30L. A remaining portion of the lower pad portion 62 after formation of the semiconductor fin 10 can be removed selective to the semiconductor fin 30, for example, by a wet etch, a dry etch, or a combination thereof.

The semiconductor fin 30 is topologically homeomorphic to a torus, and laterally surrounds, and contacts, the conductive strap structure 46. If the mask material portion 38 (See FIGS. 8A-8E) includes a pair of parallel edges 38E, the semiconductor fin 10 can include two pairs of parallel edges (e.g., the edges that are parallel to plane B-B'). A trough 37 laterally surrounded by portions of the semiconductor fin 30 and the dielectric capacitor cap 48 is formed over the buried insulator layer 20. The portions of the semiconductor fin 30 spaced by the trough 37 are herein referred to as linear portions. Each linear portion of the semiconductor fin 30 has a uniform width throughout.

A sidewall of the conductive strap structure 48 that is physically exposed to the trough 37 is herein referred to as a proximal sidewall of the conductive strap structure 48. A sidewall of the conductive strap structure 48 that is located on the opposite side of the proximal sidewall of the conductive strap structure 48 is herein referred to as a distal sidewall. The portion of the semiconductor fin 30 that is in contact with the conductive strap structure 48 is herein referred to as a wrap-around portion of the semiconductor fin 30. The buried insulator layer 20 is in contact with the bottom surface of the semiconductor fin 30.

Referring to FIGS. 13A-13E, a masked ion implantation can be optionally performed to dope the wrap-around portion of the semiconductor fin 30 with p-type dopants or n-type dopants. Specifically, an implantation mask layer 47 can be formed over the buried insulator layer 20 such that the wrap-around portion of the semiconductor fin 30 is physically exposed, and portions of the semiconductor fin 30 other than the wrap-around portion is masked by the implantation mask layer 47. The implantation mask layer 47 can be a patterned photoresist layer. The type of dopants to be implanted into the wrap-around portion is selected to be of the same type as the doping of the source region and the drain region of an access transistor to be formed employing the semiconductor fin 30. For example, if an n-type field effect transistor is to be formed as the access transistor, n-type dopants are implanted into the wrap-around portion. If a p-type field effect transistor is to be formed as the access transistor, p-type dopants are implanted into the wrap-around portion. The wrap-around portion of the semiconductor fin 30 as implanted with dopants after the masked ion implantation is herein referred to as a doped wrap-around portion 31. The masked portion of the semiconductor fin is herein referred to as an unimplanted semiconductor fin portion 30'. The implantation mask layer 47 may be subsequently removed, for example, by ashing.

Referring to FIGS. 14A-14E, a stack of gate level layers can be deposited and lithographically patterned to form various gate stacks. For example, the gate level layers can include a gate dielectric layer, a gate electrode layer, and a gate cap layer. The gate dielectric layer can include any gate dielectric material known in the art, and can be formed by conversion of surface portions of a semiconductor material (e.g., the semiconductor material of the semiconductor fin (30', 31), deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride). The gate electrode layer includes at least one conductive material, and can include a doped semiconductor material and/or a metallic material. The gate electrode layer can optionally include a work function metal layer that tunes the threshold voltage of the access transistor to be formed. The gate cap layer includes a dielectric material such as silicon oxide, silicon nitride, and/or silicon oxynitride.

The gate level layers can be patterned by a combination of lithography and etch to form gate stacks, which include an active gate stack straddling over the two parallel portions of the semiconductor fin (30', 31), i.e., the unimplanted semiconductor fin portion 30', and a passive gate stack straddling over the dielectric capacitor cap 48 and the doped wrap-around portion 31. Remaining portions of the gate dielectric layer constitute a gate dielectric 50 (which is also referred to as an active gate dielectric) within the active gate stack (50, 52, 54) and a passing gate dielectric 50' within the passing gate stack (50', 52', 54). Remaining portions of the gate electrode layer constitute a gate electrode 52 (which is also referred to as an active gate electrode) within the active gate stack (50, 52, 54) and a passing gate electrode 52' within the passing gate stack (50', 52', 54). Remaining portions of the gate cap layer constitute gate caps 54. It is understood that the active gate stack (50, 52, 54) and the passive gate stack (50', 52', 54) can be formed within an array environment in which each pair of a trench capacitor (12, 42, 44) and an access transistor is a cell of a dynamic random access memory (DRAM) array, and that each active gate stack (50, 52, 54) can extend to become a passing gate stack (50', 52', 54) for an adjacent DRAM cell.

The gate dielectric 50 straddles over portions of the semiconductor fin (30', 31) that correspond to a pair of channel regions of the access field effect transistor to be subsequently formed. The gate electrode 52 contacts the gate dielectric 50. The passing gate dielectric 50' can include the same material as the gate dielectric 50 and/or have the same thickness as the gate dielectric 50. The passing gate dielectric 50' is formed on the sidewalls of the conductive strap structure 46. The passing gate electrode includes the same material as the gate electrode 52, and is located over the dielectric capacitor cap 48 and on the passing gate dielectric 50'. The passing gate dielectric 50' laterally contacts sidewalls of the conductive strap structure 46 and sidewalls of the passing gate electrode 52'.

Referring to FIGS. 15A-15E, source extension regions 33 and drain extension regions 35 can be optionally formed by implanting dopants of the same conductivity type as the dopants in the doped wrap-around region (See FIGS. 13A-13E). The active gate stack (50, 52, 54) and the passing gate stack (50', 52', 54) function as a masking layer during the ion implantation that forms the source extension regions 33 and the drain extension regions 35.

Gate spacers 56 can be formed by depositing a conformal dielectric layer and anisotropically etching the conformal dielectric layer. In one embodiment, the gate spacers 56 can include a dielectric material different from the dielectric material of the buried insulator layer 20. For example, if the buried insulator layer 20 includes silicon oxide, the gate spacers 56 can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fin are removed. The topmost portions of the gate spacers 56 are vertically offset from the top surfaces of the gate caps 54. The thickness of the gate caps 54 can be selected such that the topmost portion of the gate spacers 56 contact a bottom portion of each gate cap 54, thereby encapsulating the gate electrode 52 and the passing gate electrode 52'.

Dopants of the same conductivity type as the dopants in the source extension regions 33 and the drain extension regions 35 can be implanted into the semiconductor fin employing the active gate stack (50, 52, 54), the passing gate stack (50', 52', 54), and the gate spacers 56 as an implantation mask. A source region 34 of an access transistor can be formed to continuously extend from one source extension region 33 located within one linear portion of the semiconductor fin to another source extension 33 in another linear portion of the semiconductor fin. The doped wrap-around portion 31 of the semiconductor fin is incorporated into the source region 34. It is noted that the portion of the source region 34 that underlies the passing gate stack (50', 52', 54) has lesser concentration of dopant atoms than the portions of the source region 34 that do not underlie the passing gate stack (50', 52', 54).

A drain region 36 of the access transistor can be formed on the opposite side of the source region 34 relative to the active gate stack (50, 52, 54). The grain region 36 is laterally spaced from the source region 34 by the pair of channel regions 32, which are portions of the semiconductor fin that are not implanted with dopants during the ion implantation steps that form the source extension regions 33, the drain extension regions 35, the source region 34, and the drain region 36. Sidewalls of the pair of channel regions 32 are parallel to sidewalls of the source region 34 and the drain region 36.

The access transistor controls current flow into, and out of, the inner electrode 44 of the trench capacitor (12, 42, 44). The semiconductor fin includes the source region 34 that laterally contacts the conductive strap structure 46, the pair of channel region 32, the drain region 36, and, optionally, the source extension region 33 and the drain extension region 35. The distal sidewall of the conductive strap structure 46 is laterally offset by a greater distance from the pair of channel regions 32 than a lateral distance between the geometrical center CS of the conductive strap structure 46 and the pair of channel regions 32. The distal sidewall of the conductive strap structure 46 is in contact with the semiconductor fin (34, 33, 32, 35, 36), and specifically, is in contact with the inner sidewalls of the source region 34 of the semiconductor fin (34, 33, 32, 35, 36).

Figure 15A:
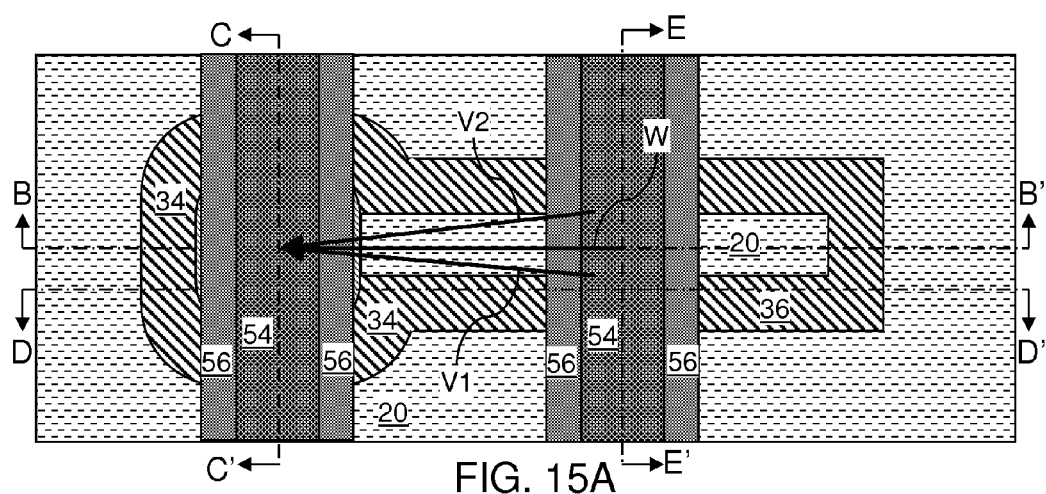
FIG. 15A is a top-down view of the first exemplary semiconductor structure after formation of gate spacers and source and drain regions according to the first embodiment of the present disclosure.
Figure 15B:
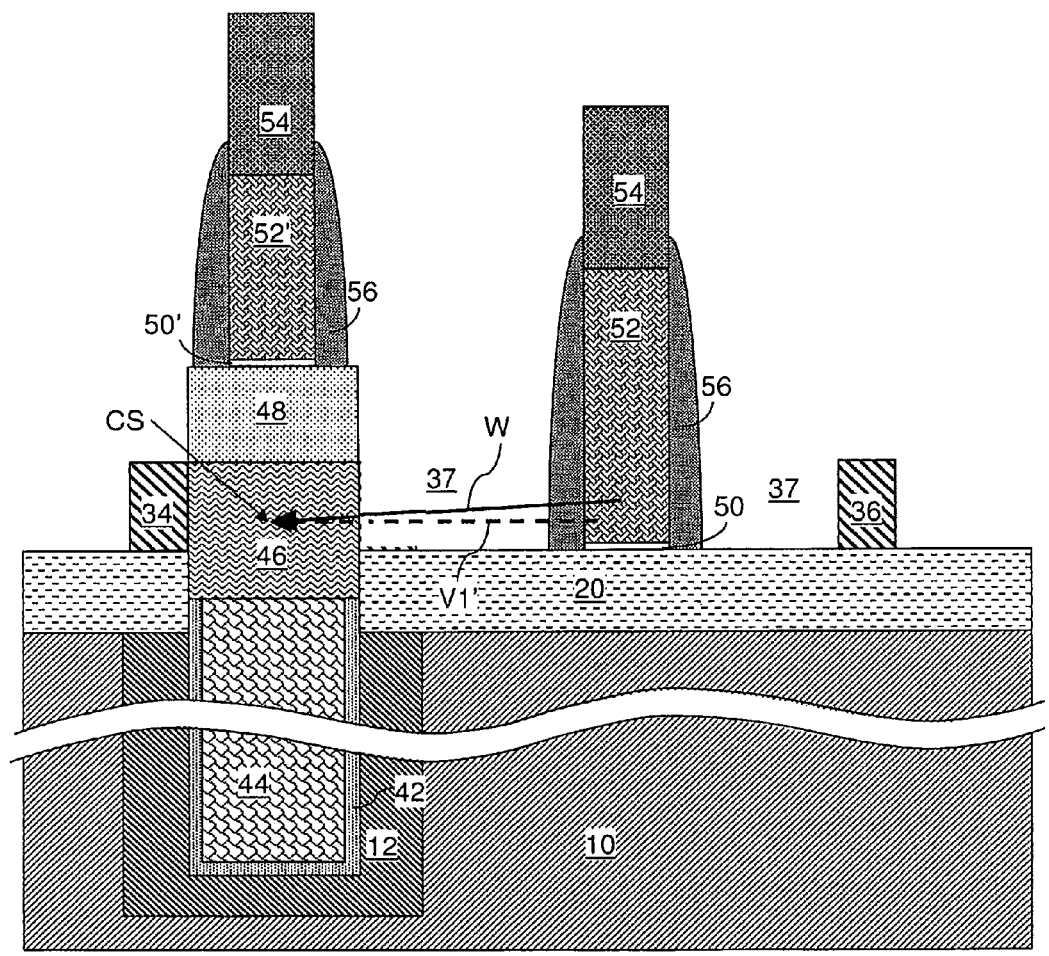
FIG. 15B is a vertical cross-sectional view of the first exemplary semiconductor structure along the vertical plane B-B' of FIG. 15A.
Figure 15C:
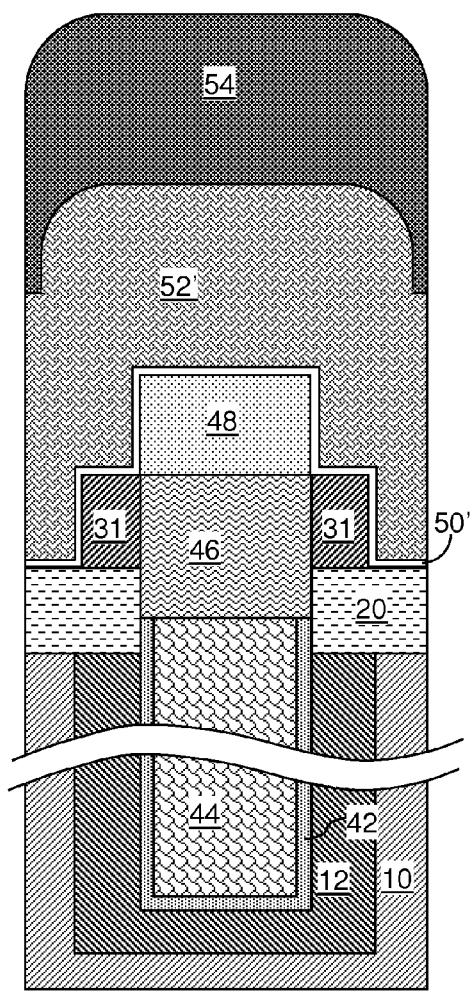
FIG. 15C is a vertical cross-sectional view of the first exemplary semiconductor structure along the vertical plane C-C' of FIG. 15A.
Figure 15E:
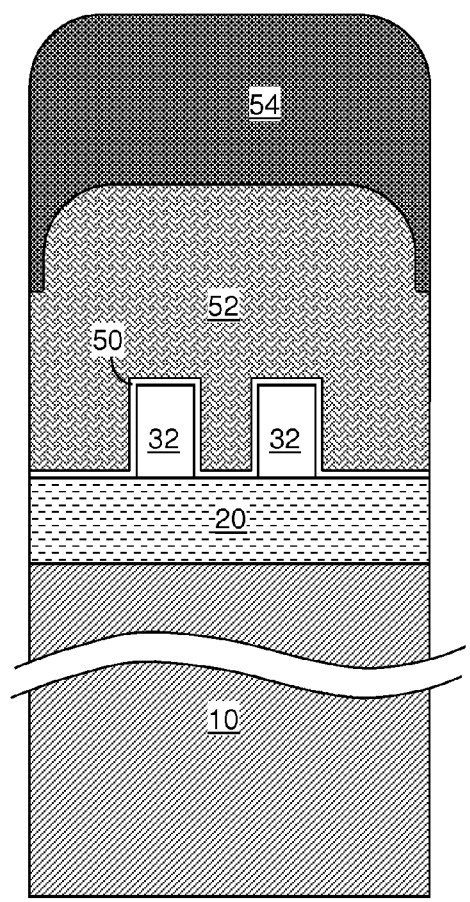
FIG. 15E is a vertical cross-sectional view of the first exemplary semiconductor structure along the vertical plane E-E' of FIG. 15A.
Figure 15D:
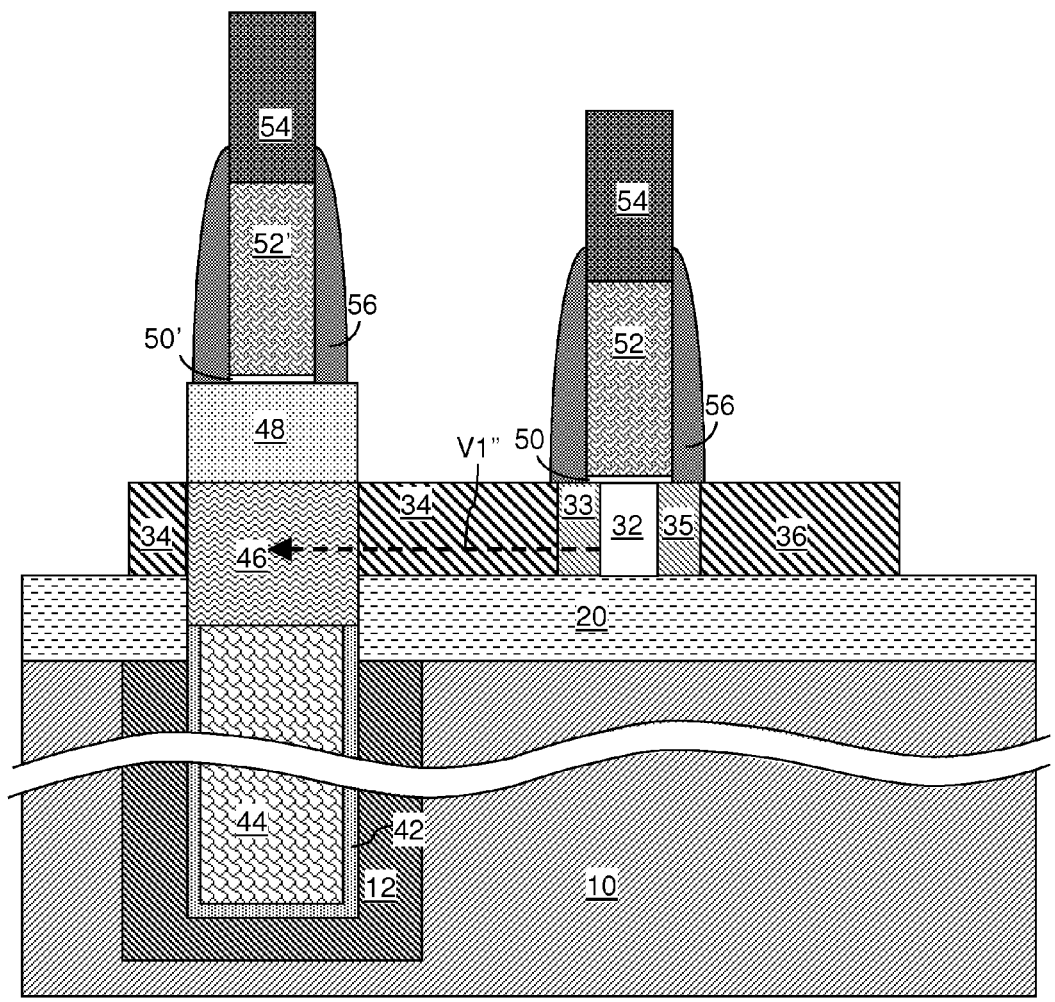
FIG. 15D is a vertical cross-sectional view of the first exemplary semiconductor structure along the vertical plane D-D' of FIG. 15A.

The lateral distance between the geometrical center CS of the conductive strap structure 46 and the pair of channel regions 32 may be represented by the length of a first horizontal vector V1 that extends from an interface between a source extension region 33 and one of the two channel regions 32 (herein referred to as a first channel region) to the geometrical center CS of the conductive strap structure 46. The length of the first horizontal vector V1 represents the shortest distance between the first channel region and the geometrical center CS of the conductive strap structure 46. Alternately, the lateral distance between the geometrical center CS of the conductive strap structure 46 and the pair of channel regions 32 may be represented by the length of a second horizontal vector V2 that extends from an interface between another source extension region 33 and the other of the channel regions 32 (herein referred to as a second channel region) to the geometrical center CS of the conductive strap structure 46. The length of the second horizontal vector V2 represents the shortest distance between the first channel region 32 and the geometrical center CS of the conductive strap structure 46. The lateral distance between the geometrical center CS of the conductive strap structure 46 and the pair of channel regions 32 is the lesser of the length of the first horizontal vector V1 and the second horizontal vector V2. FIG. 15B illustrates a projection V1' of the first horizontal vector V1 to the vertical plane B-B'. FIG. 15D illustrates another projection V1" of the first horizontal vector V1 to the vertical plane D-D'.

Further, each channel region 32 in the pair of channel regions 32 is parallel to each other, and is laterally spaced from each other along a direction (i.e., the horizontal direction within the E-E' plane) that is perpendicular to a direction connecting the geometrical center CS of the conductive strap structure 46 and the geometrical center of the pair of channel regions 32. The same type of integrals employed to calculate the coordinates of the geometrical center CS of the conductive strap structure 46 can be employed to calculate the coordinates of the geometrical center of the pair of channel regions 32 provided that the integrals are performed over the entire volume of the pair of channel regions 32. The starting point of the vector W represents the geometrical center of the pair of channel regions 32, and the end point of the vector W represents the geometrical center CS of the conductive strap structure 46.

The gate dielectric 50 overlies the pair of channel regions 32, and laterally contacts sidewalls of the channel regions 32. The gate electrode 52 contacts top surfaces and sidewall surfaces of the gate dielectric 50.

Referring to FIGS. 16A-16E, a contact-level dielectric layer 80 and various contact via structures can be subsequently formed. The contact-level dielectric layer 80 includes a dielectric material such as silicon oxide, silicon nitride, organosilicate glass (OSG), or any other dielectric material that can be employed to form metal interconnect structures as known in the art. The various contact via structures can include, for example, gate contact via structure 82 that contact the gate electrode 50 or the passing gate electrode 50', and a drain contact via structure 86 that contact the drain region 36. Optionally, metal semiconductor alloy regions (not shown) such as metal silicide portions can be formed between the drain region 36 and the drain contact via structure 86 and/or between the active and/or passing gate electrodes (52, 52') and the gate contact via structures 82.

Figure 16A:
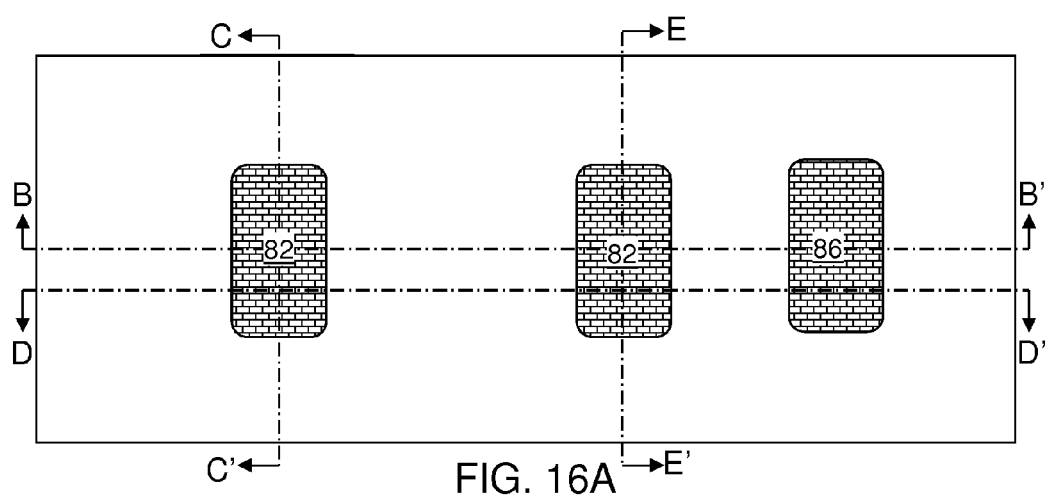
FIG. 16A is a top-down view of the first exemplary semiconductor structure after formation of a contact-level dielectric layer and various contact via structures according to the first embodiment of the present disclosure.
Figure 16B:
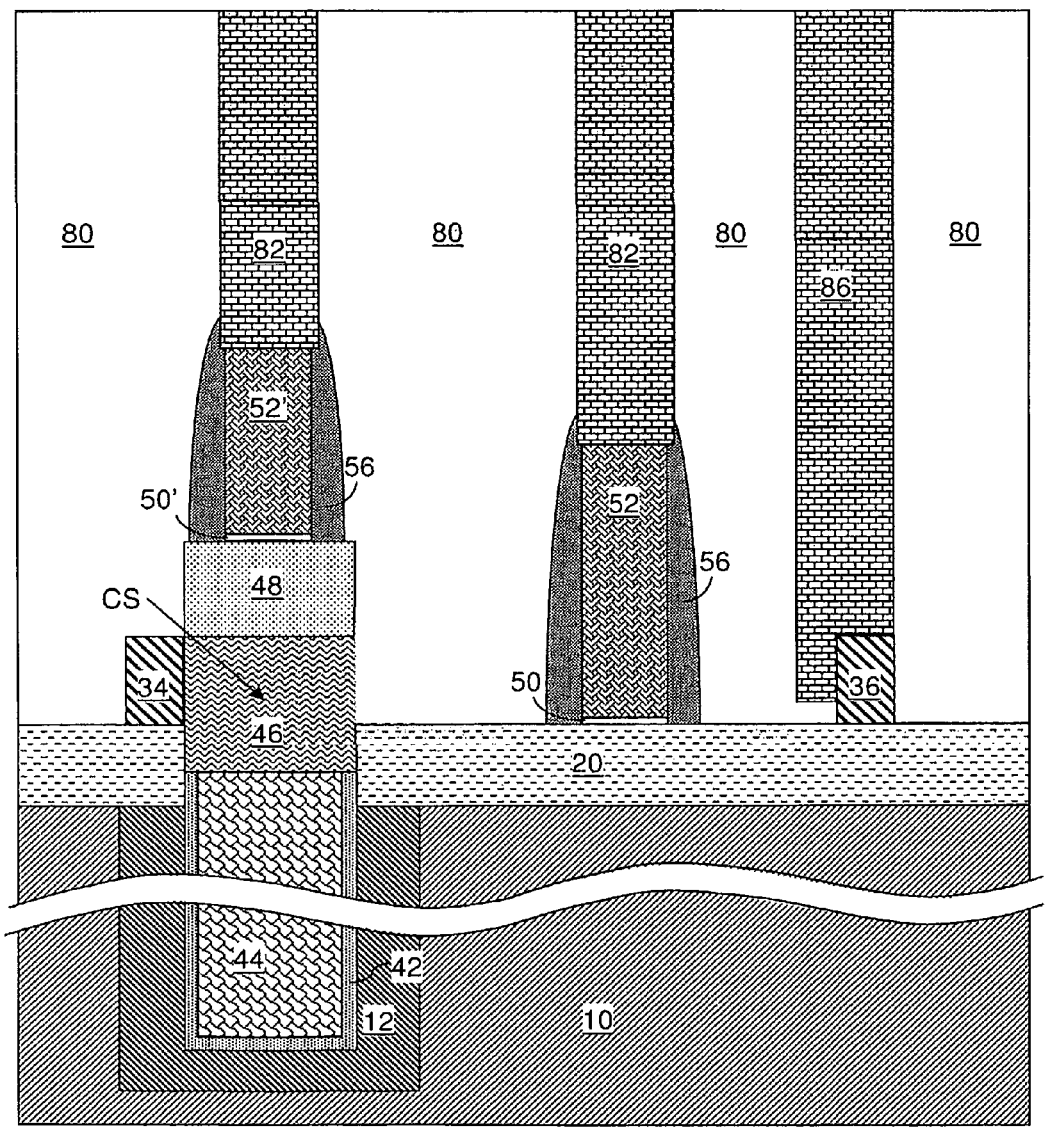
FIG. 16B is a vertical cross-sectional view of the first exemplary semiconductor structure along the vertical plane B-B' of FIG. 16A.
Figure 16C:
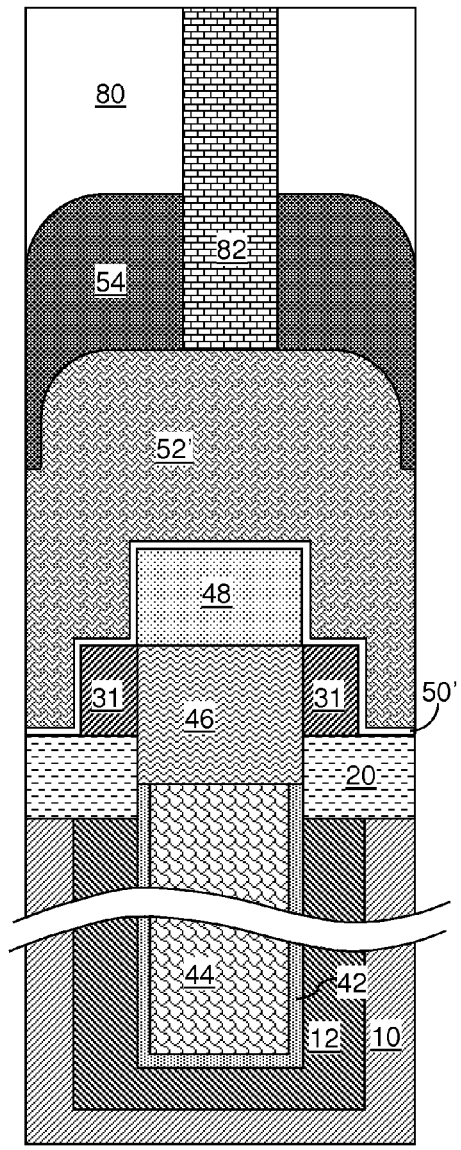
FIG. 16C is a vertical cross-sectional view of the first exemplary semiconductor structure along the vertical plane C-C' of FIG. 16A.
Figure 16E:
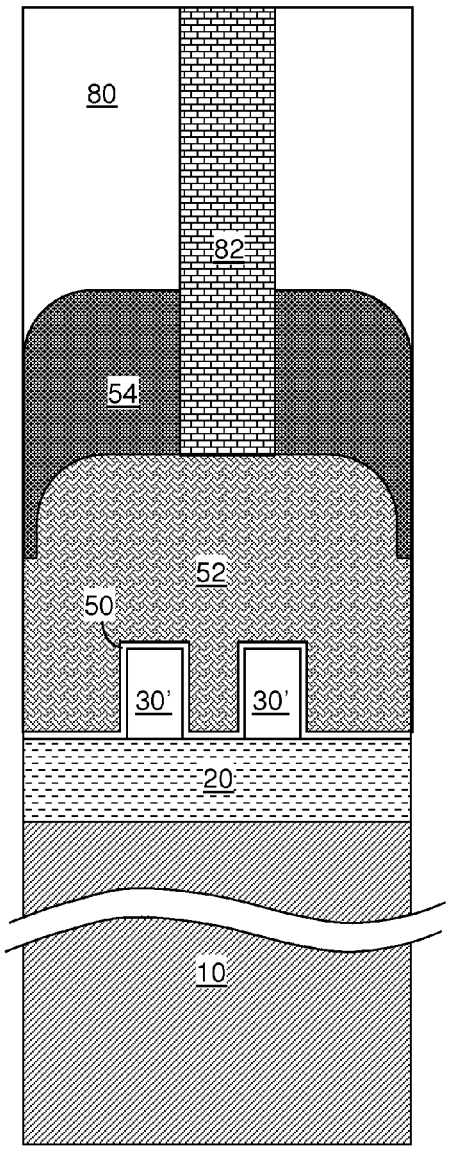
FIG. 16E is a vertical cross-sectional view of the first exemplary semiconductor structure along the vertical plane E-E' of FIG. 16A.
Figure 16D:
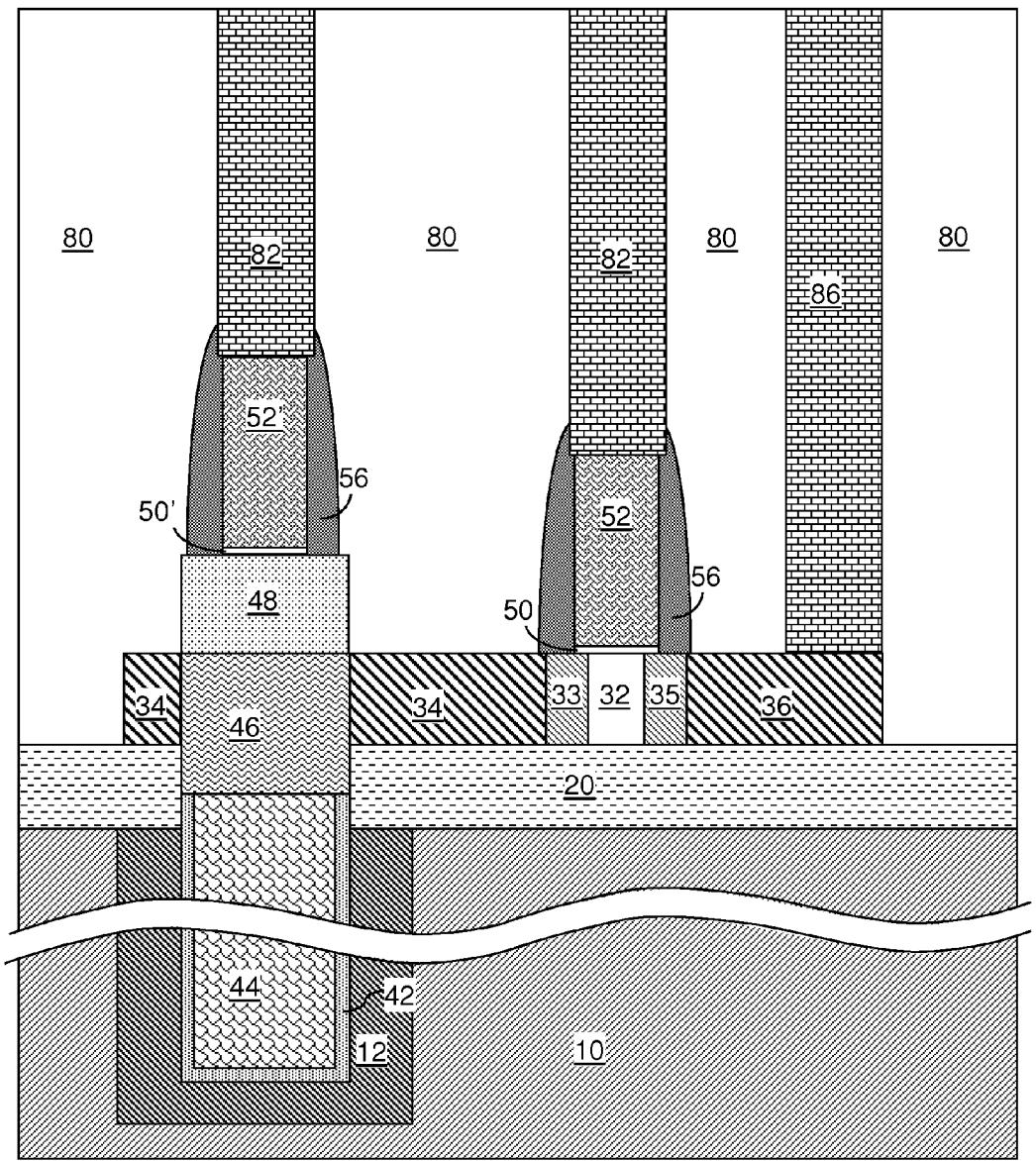
FIG. 16D is a vertical cross-sectional view of the first exemplary semiconductor structure along the vertical plane D-D' of FIG. 16A.
Figure 16F:
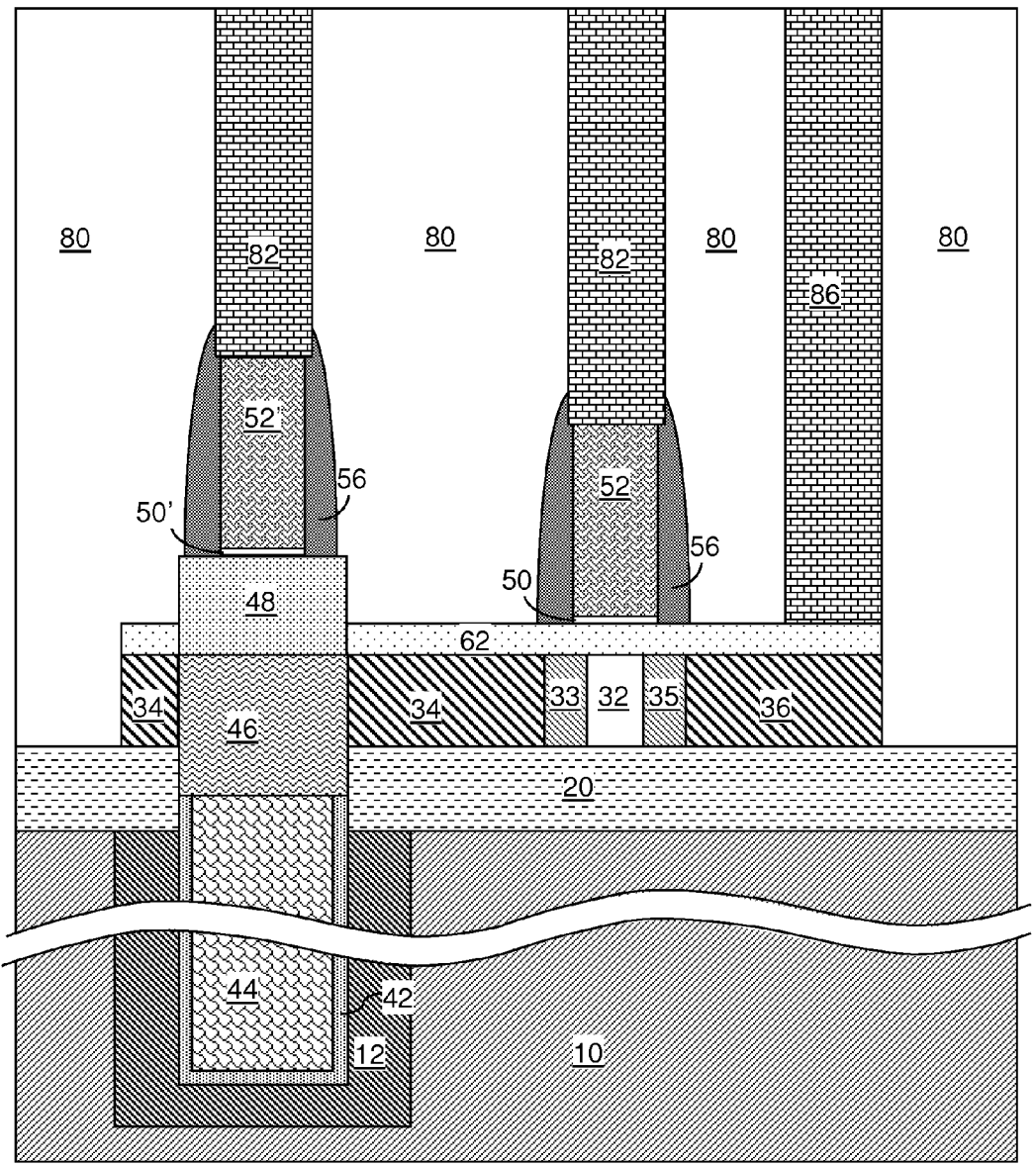
FIG. 16F is a vertical cross-sectional view of a first variation of the first exemplary semiconductor structure along a vertical plane corresponding to the vertical plane D-D' of FIG. 16A.
Figure 17A:
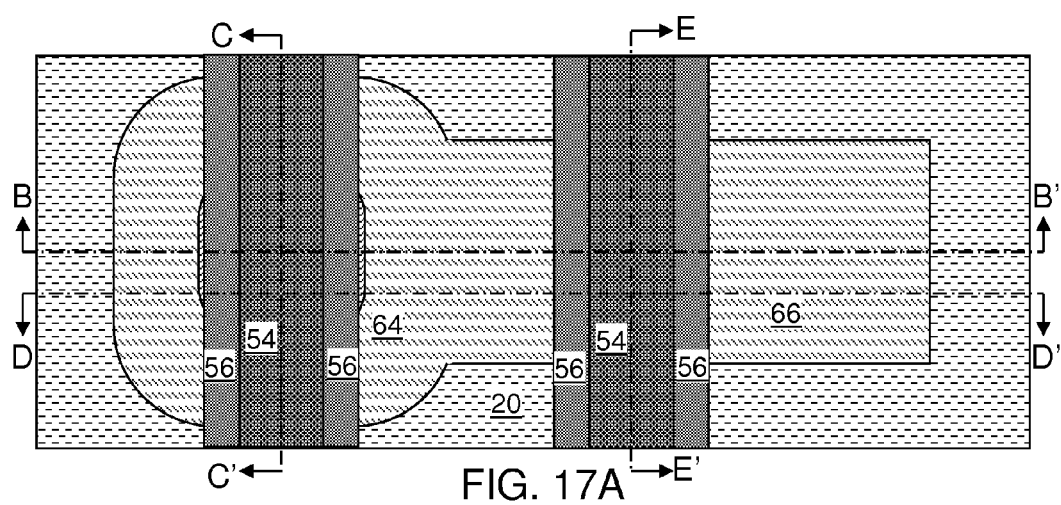
FIG. 17A is a top-down view of a second variation of the first exemplary semiconductor structure after formation of epitaxially expanded source regions and an epitaxially expanded drain region according to the first embodiment of the present disclosure.
Figure 17B:
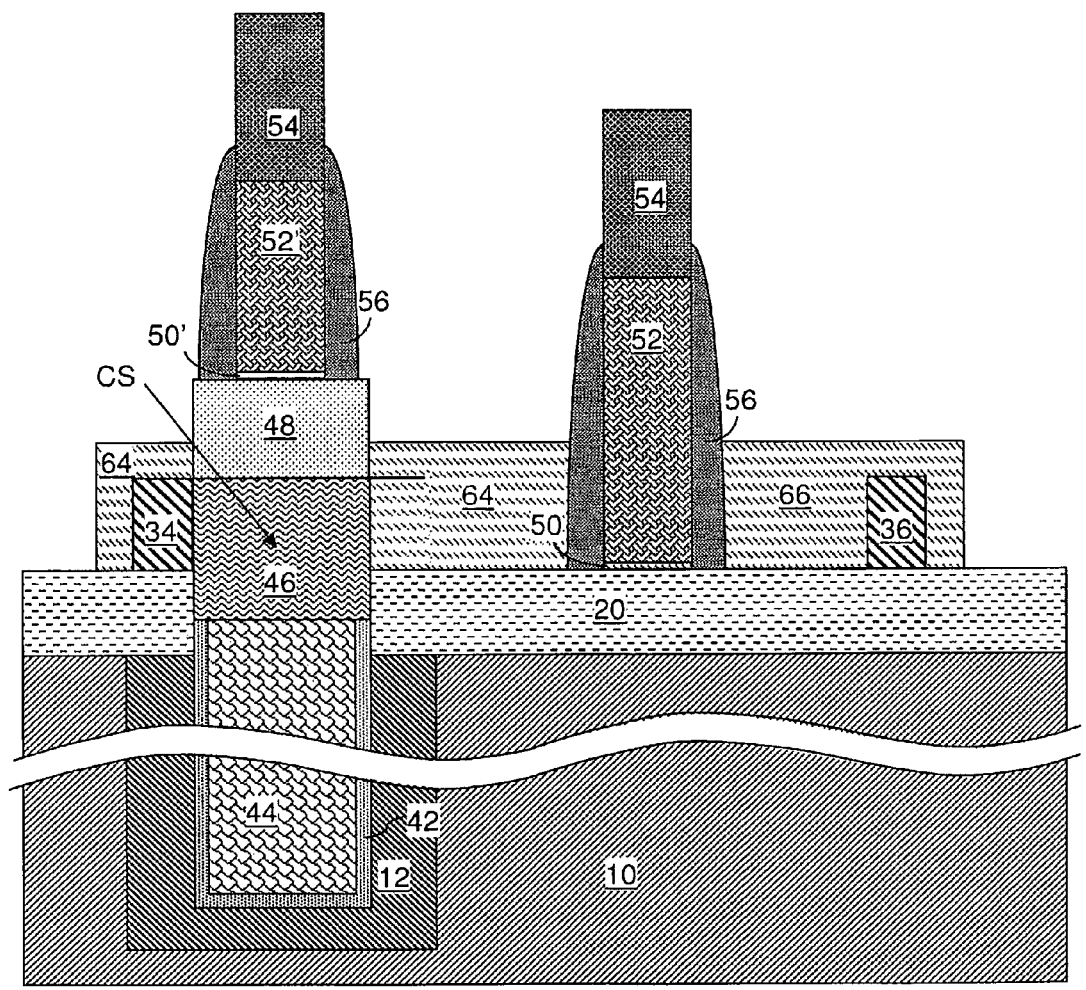
FIG. 17B is a vertical cross-sectional view of the second variation of the first exemplary semiconductor structure along the vertical plane B-B' of FIG. 17A.
Figure 17C:
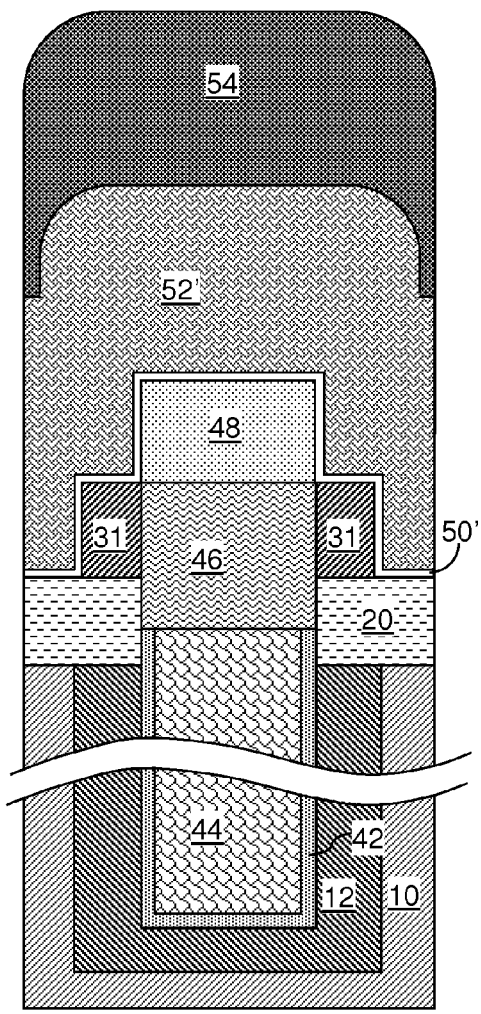
FIG. 17C is a vertical cross-sectional view of the second variation of the first exemplary semiconductor structure along the vertical plane C-C' of FIG. 17A.
Figure 17E:
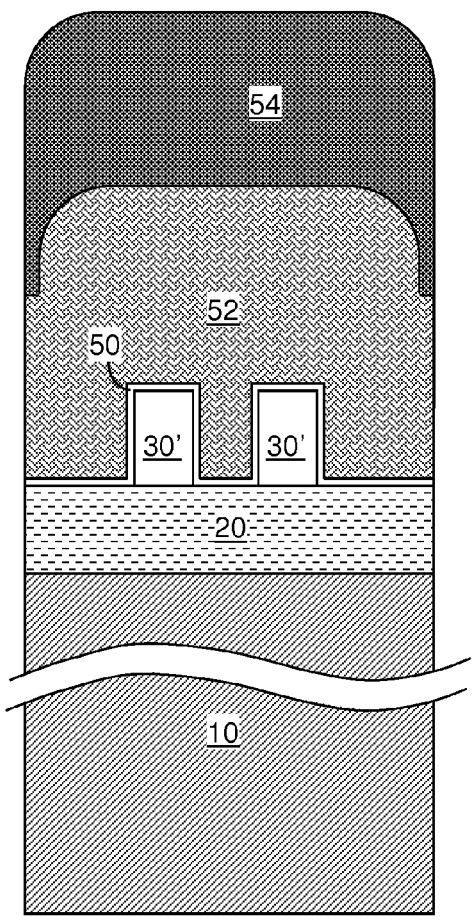
FIG. 17E is a vertical cross-sectional view of the second variation of the first exemplary semiconductor structure along the vertical plane E-E' of FIG. 17A.
Figure 17D:
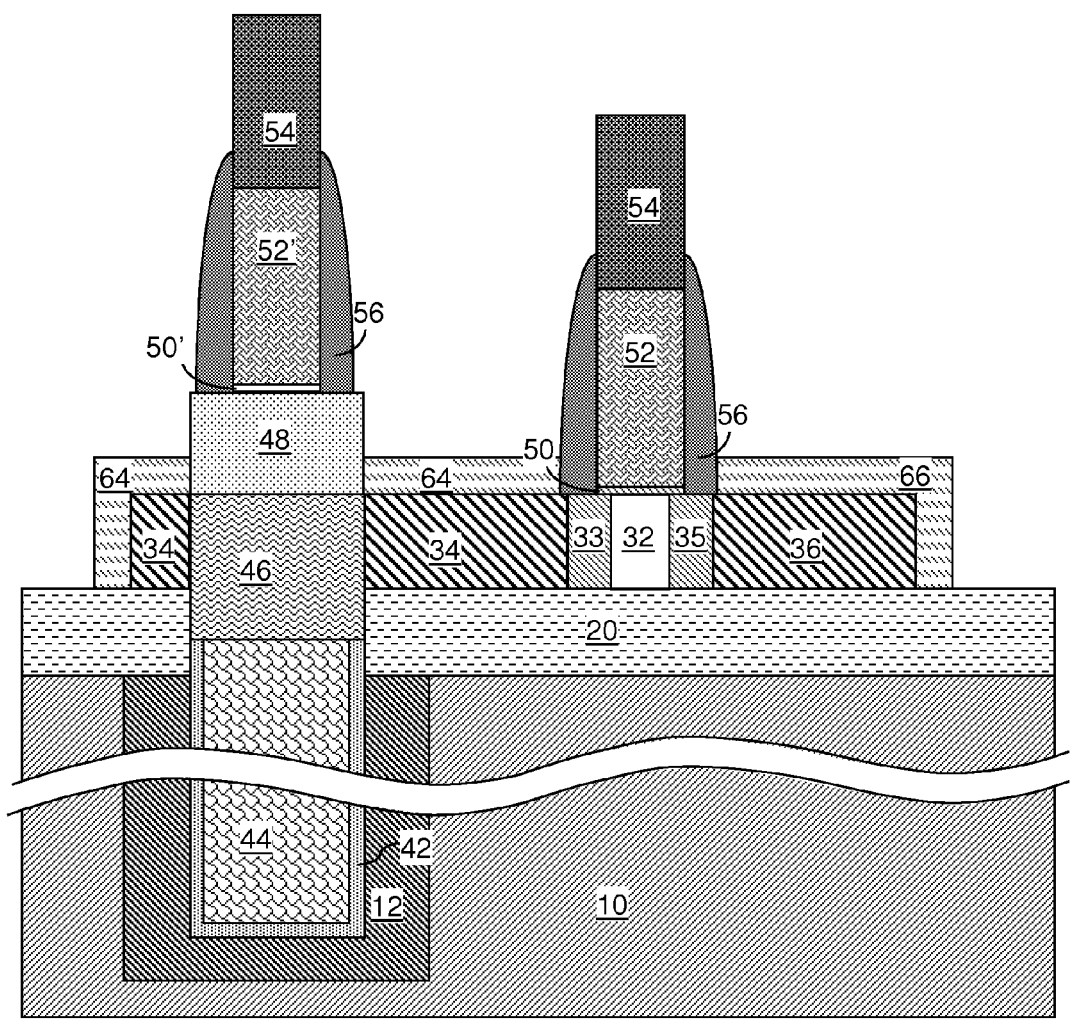
FIG. 17D is a vertical cross-sectional view of the second variation of the first exemplary semiconductor structure along the vertical plane D-D' of FIG. 17A.

The structure illustrated in FIGS. 16A-16E includes a trigate fin field effect transistor (finFET) as the access transistor. A dual gate finFET can also be employed as the access transistor in lieu of the trigate finFET, for example, by not completely removing the lower pad portion 62 at the processing step of FIGS. 12A-12E, to provide a first variation of the first exemplary semiconductor structure as illustrated in FIG. 16F.

Referring to FIGS. 17A-17E, a second variation of the first exemplary semiconductor structure is derived from the first exemplary semiconductor structure of FIGS. 15A-15E by performing selective epitaxy to form an epitaxially expanded source region 64 and an epitaxially expanded drain region 66. The selective epitaxy deposits a doped semiconductor material directly on the semiconductor surfaces, i.e., on the physically exposed surfaces of the source region 34 and the drain region 36, while not depositing any semiconductor material on dielectric surfaces. Dopants of the same conductivity type as the dopants in the source region 34 and the drain region 36 are incorporated into the epitaxially expanded source region 64 and the epitaxially expanded drain region 66. The two linear portions of the semiconductor fin (34, 33, 32, 35, 36) become merged as the epitaxially expanded source region 64 fills the portion of the trough 37 (See FIG. 15B) on the source side, and as the epitaxially expanded drain region 66 fills the portion of the trough on the drain side. The epitaxially expanded source region 64 includes two physically disjoined portions that are separated by the passing gate stack (50', 52', 54) and a gate spacer 56 directly thereupon.

The epitaxially expanded source region 64 and the epitaxially expanded drain region 66 can include the same material as, or a different semiconductor material from, the semiconductor material of the source region 34 and the drain region 36. Further, the epitaxially expanded source region 64 and the epitaxially expanded drain region 66 can include the same dopant concentration as, or a different dopant concentration from, the dopant concentration of the source region 34 and the drain region 36. The thickness of the epitaxially expanded source region 64 and the epitaxially expanded drain region 66, as measured from above the topmost surface of the source region 34 or the drain region 36, can be from 5 nm to 100 nm, although lesser and greater thicknesses can also be employed.

The semiconductor fin incorporates the epitaxially expanded source region 64 and the epitaxially expanded drain region 66 during the selective epitaxy process. Upon completion of selective epitaxy, the semiconductor fin (34, 33, 32, 35, 36, 64, 66) includes the epitaxially-expanded source region 64 that contacting the source region 34, and the epitaxially-expanded drain region 66 contacting, and electrically shorting, portions of the drain region 36. In one embodiment, the source region 34 and the epitaxially-expanded source region 64 can contact the entirety of sidewalls of the conductive strap structure 46.

Referring to FIGS. 18A-18E, a contact-level dielectric layer 80 and various contact via structures can be subsequently formed. The various contact via structures can include, for example, gate contact via structure 82 that contact the gate electrode 50 or the passing gate electrode 50', and a drain contact via structure 86 that contact the epitaxially expanded drain region 66. Optionally, metal semiconductor alloy regions (not shown) such as metal silicide portions can be formed between the epitaxially expanded drain region 66 and the drain contact via structure 86 and/or between the active and/or passing gate electrodes (52, 52') and the gate contact via structures 82.

Figure 18B:
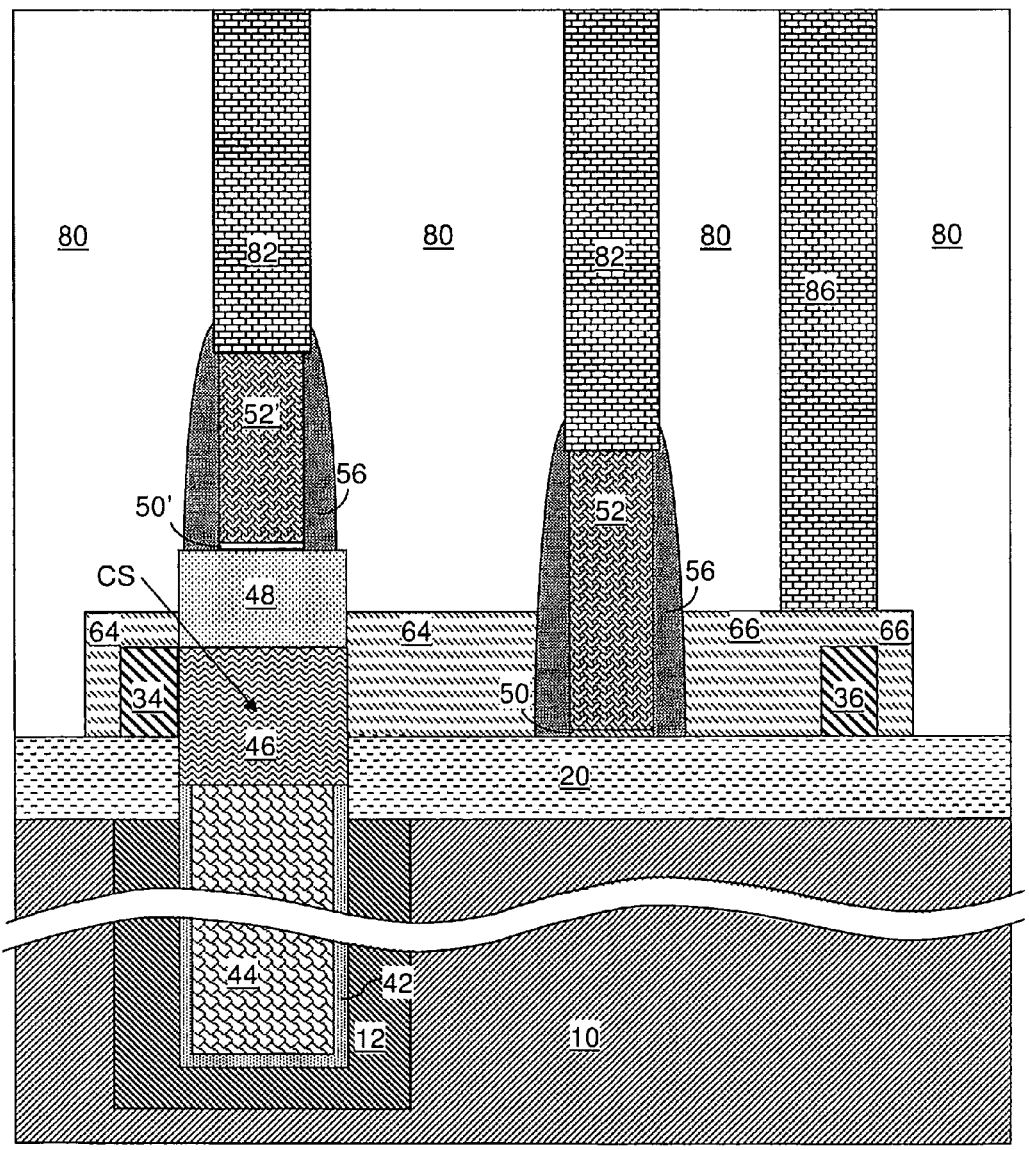
FIG. 18B is a vertical cross-sectional view of the second variation of the first exemplary semiconductor structure along the vertical plane B-B' of FIG. 18A.
Figure 18C:
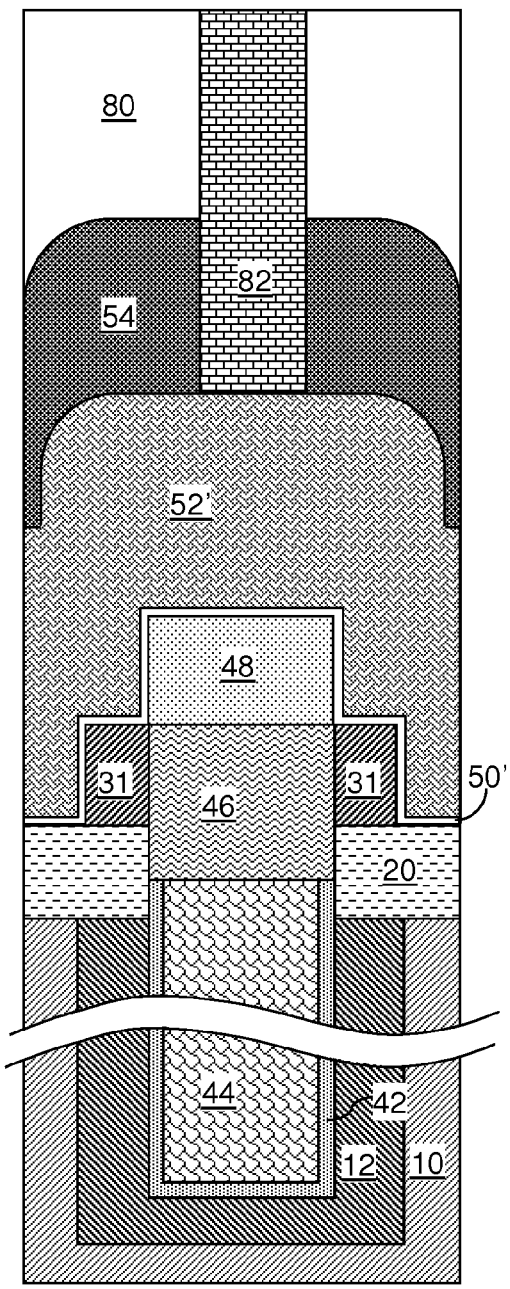
FIG. 18C is a vertical cross-sectional view of the second variation of the first exemplary semiconductor structure along the vertical plane C-C' of FIG. 18A.
Figure 18E:
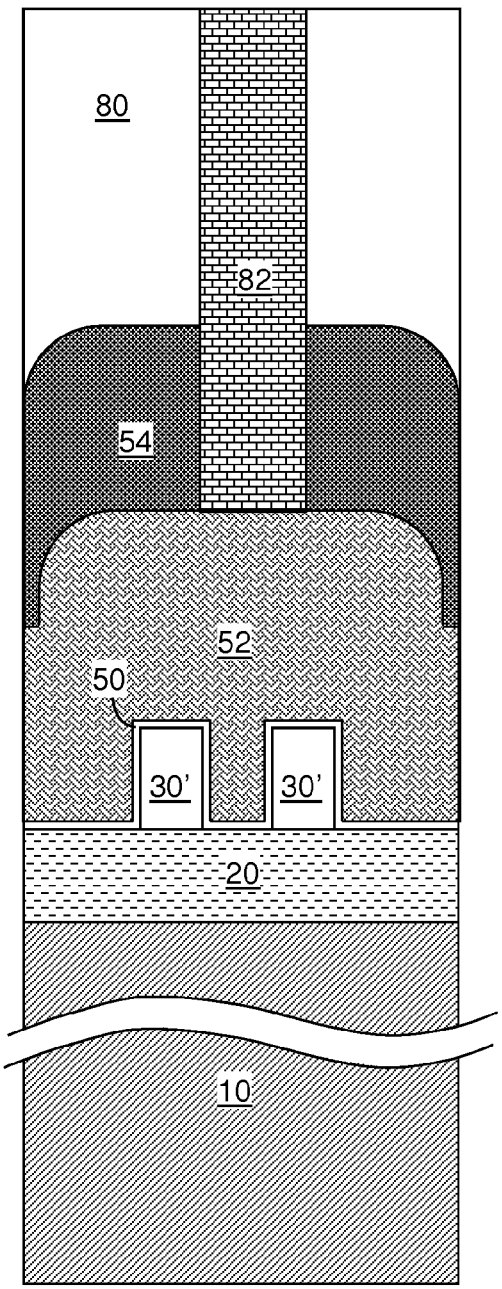
FIG. 18E is a vertical cross-sectional view of the second variation of the first exemplary semiconductor structure along the vertical plane E-E' of FIG. 18A.
Figure 18D:
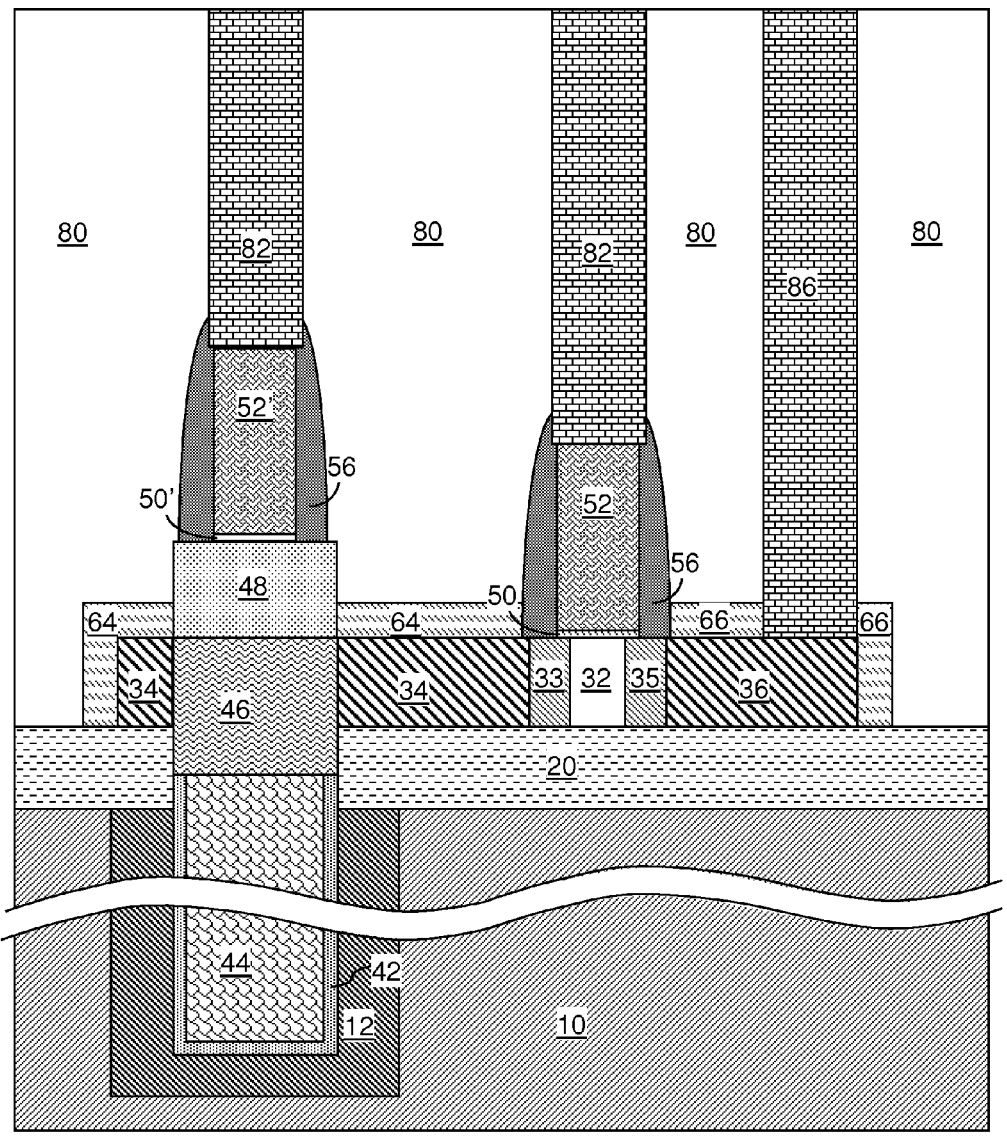
FIG. 18D is a vertical cross-sectional view of the second variation of the first exemplary semiconductor structure along the vertical plane D-D' of FIG. 18A.
Figure 18F:
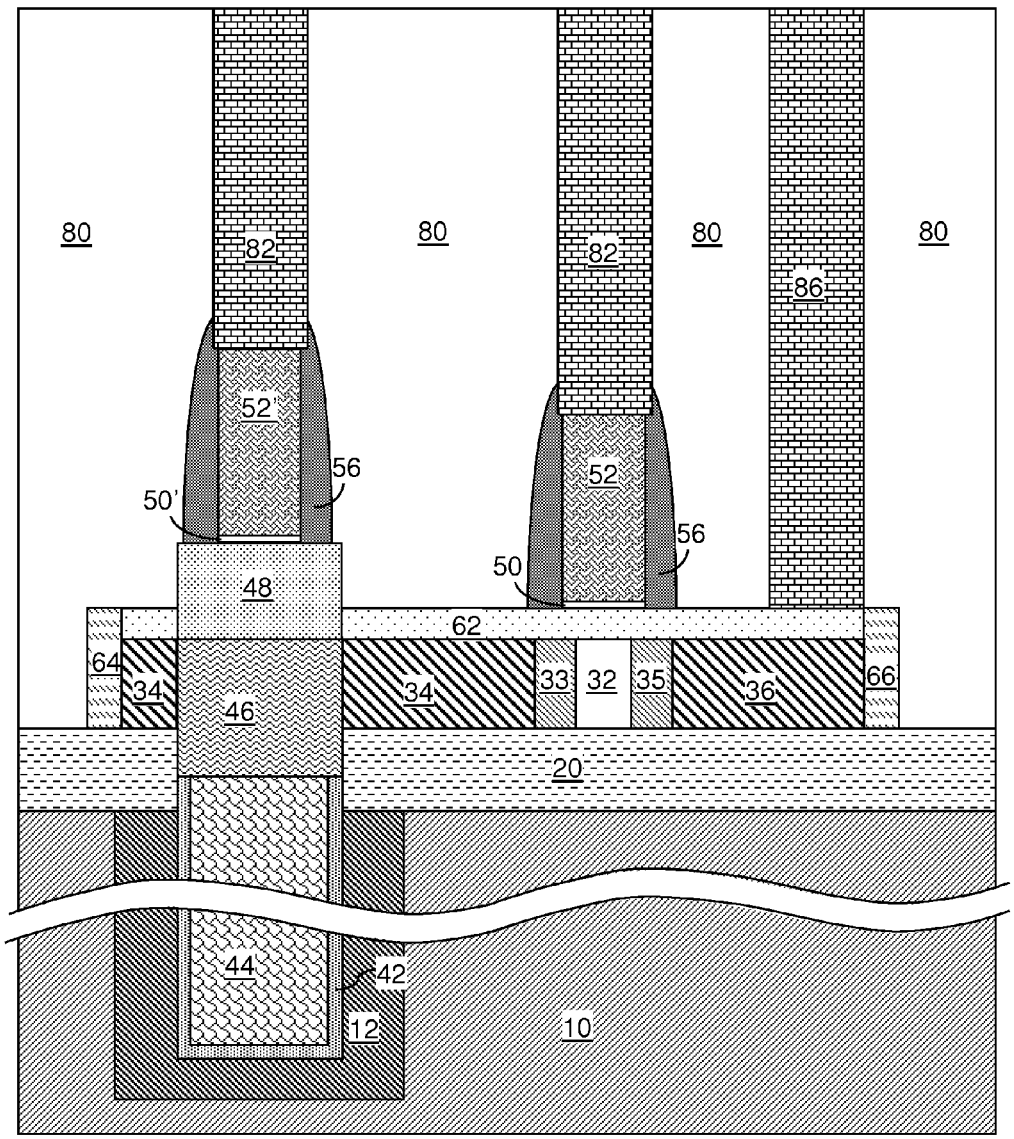
FIG. 18F is a vertical cross-sectional view of a third variation of the first exemplary semiconductor structure along a vertical plane corresponding to the vertical plane D-D' of FIG. 18A.

The structure illustrated in FIGS. 18A-18E includes a trigate fin field effect transistor (finFET) as the access transistor. A dual gate finFET can also be employed as the access transistor in lieu of the trigate finFET, for example, by not completely removing the lower pad portion 62 at the processing step of FIGS. 12A-12E, to provide a third variation of the first exemplary semiconductor structure as illustrated in FIG. 18F.

Figure 19A:
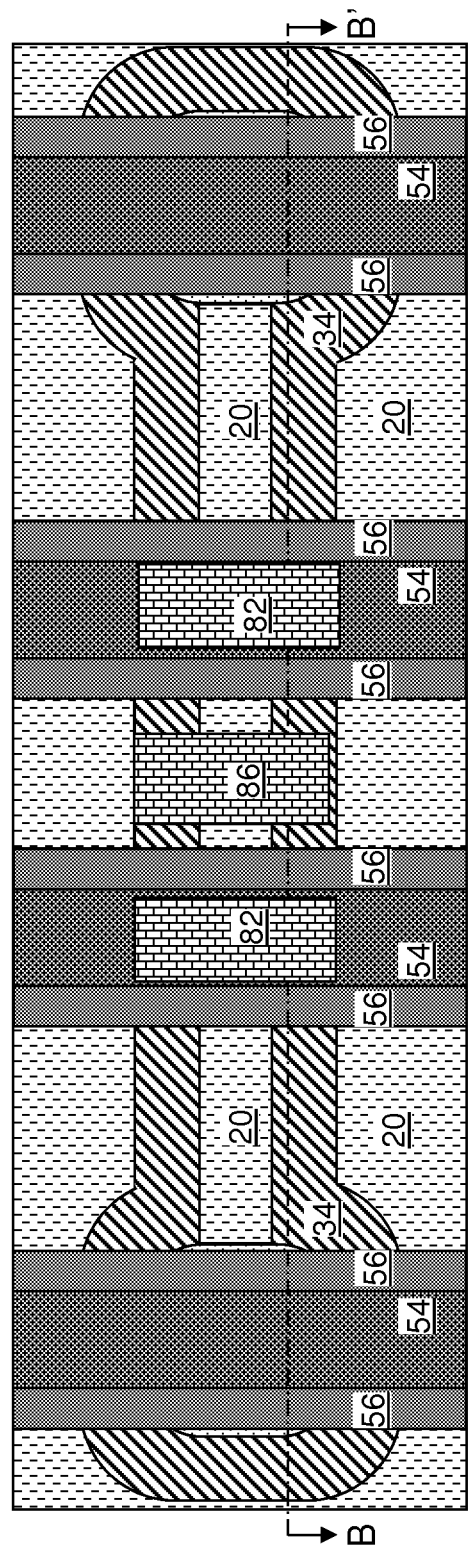
FIG. 19A is a top-down view of a second exemplary semiconductor structure in which a contact-level dielectric layer is not shown for clarity according to a second embodiment of the present disclosure.
Figure 19B:
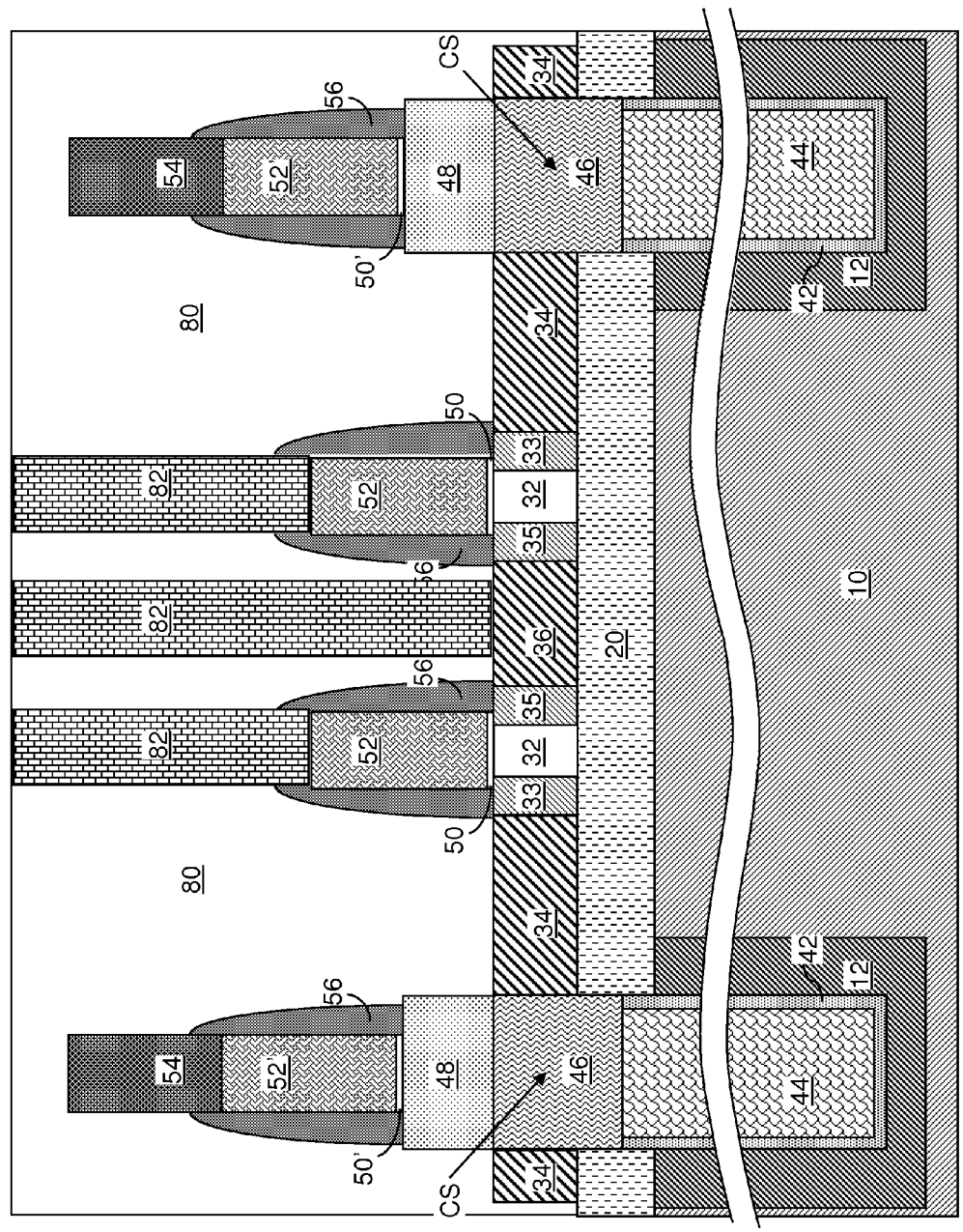
FIG. 19B is a vertical cross-sectional view of the second exemplary semiconductor structure along the vertical plane B-B' of FIG. 19A.

Referring to FIGS. 19A and 19B, a second exemplary semiconductor structure according to a second embodiment of the present disclosure can be formed employing the same processing steps of the first exemplary semiconductor structure, and by modifying the pattern for various elements in the first exemplary semiconductor structure. Specifically, a pair of deep trench capacitors is formed, and the mask material portion 38 is patterned to extend between two dielectric capacitor caps 48. The two linear portions of the semiconductor fin 30 laterally extend between the two dielectric capacitor caps 48. The semiconductor fin 30 is formed as a structure homeomorphic to a torus, and laterally surrounds, and contacts, two conductive strap structures 46. A pair of drain regions 36 laterally separated by the same distance as two pairs of channel regions 32 are formed within the semiconductor fin. Two access transistors share the pair of drain regions 36. While each access transistor is a trigate finFET, a variation that employs a dual gate finFET as illustrated in FIG. 16F can also be implemented.

Figure 20A:
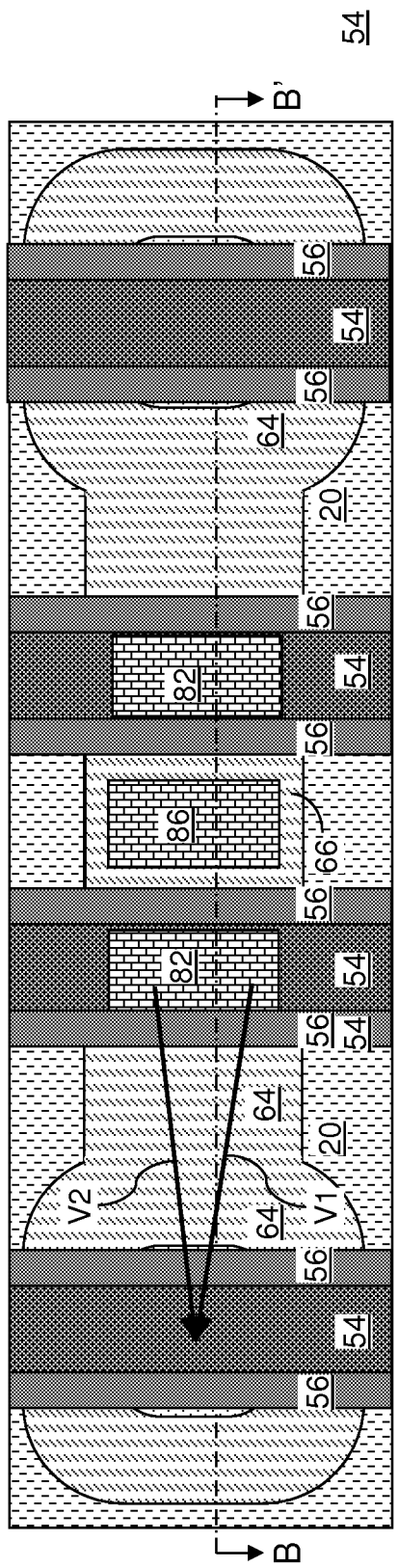
FIG. 20A is a top-down view of a variation of the second exemplary semiconductor structure in which a contact-level dielectric layer is not shown for clarity according to a second embodiment of the present disclosure.
Figure 20B:
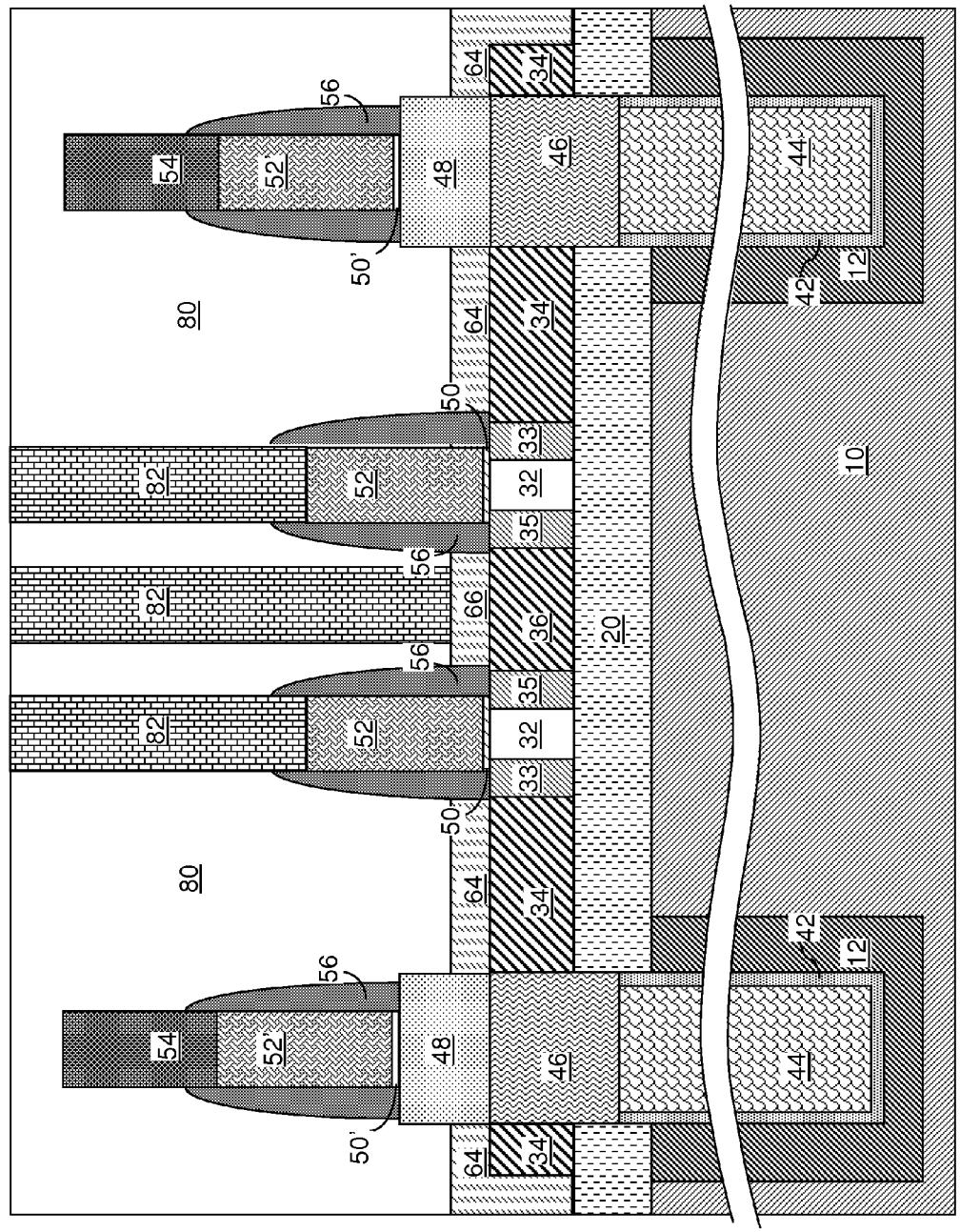
FIG. 20B is a vertical cross-sectional view of the variation of the second exemplary semiconductor structure along the vertical plane B-B' of FIG. 20A.

Referring to FIGS. 20A and 20B, a variation of the second exemplary semiconductor structure is derived from the second exemplary semiconductor structure by employing the same processing steps as the processing steps employed to form the second variation of the first exemplary semiconductor structure, and by modifying the pattern for various elements in the first exemplary semiconductor structure in the same manner as in the second exemplary semiconductor structure. The epitaxially-expanded drain region 66 electrically shorts the pair of drain regions 36 as illustrated in FIGS. 19A and 19B. Two access transistors share the pair of drain regions 34 and the epitaxially-expanded drain regions 66. While each access transistor is a trigate finFET, a variation that employs a dual gate finFET as illustrated in FIG. 18F can also be implemented.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a trench capacitor embedded in a substrate and comprising an inner electrode, a node dielectric, and an outer electrode;
    a conductive strap structure in contact with, and overlying, said inner electrode;
    a dielectric capacitor cap in contact with a top surface of said conductive strap structure, wherein outermost vertical sidewalls of said dielectric capacitor cap are vertically aligned with outermost vertical sidewalls of said conductive strap structure;
    a semiconductor fin including a pair of channel regions, wherein a distal sidewall of said conductive strap structure is laterally offset by a greater distance from said pair of channel regions than a lateral distance between a geometrical center of said conductive strap structure and said pair of channel regions; and
    an access transistor that controls current flow into, and out of, said trench capacitor, wherein said semiconductor fin comprises a source region of said access transistor that directly contacts said conductive strap structure, wherein a topmost surface of said source region is coplanar with a bottommost surface of said dielectric capacitor cap.

2. The semiconductor structure of claim 1, further comprising an insulator layer overlying said outer electrode and in contact with a surface of said semiconductor fin.

3. The semiconductor structure of claim 1, wherein said semiconductor fin is topologically homeomorphic to a torus and laterally surrounds said conductive strap structure.

4. The semiconductor structure of claim 1, wherein each channel region in said pair of channel regions is parallel to each other, and is laterally spaced from each other along a direction that is perpendicular to a direction connecting said geometrical center of said conductive strap structure and a geometrical center of said pair of channel regions.

5. The semiconductor structure of claim 1, wherein an entirety of said bottommost surface of said dielectric capacitor cap is planar, and coincides with an entirety of said top surface of said conductive strap structure.

6. The semiconductor structure of claim 1, further comprising a gate dielectric overlying said pair of channel regions and contacting sidewall surfaces of said channel regions.

7. The semiconductor structure of claim 6, further comprising a gate electrode contacting top surfaces and sidewall surfaces of said gate dielectric.

8. The semiconductor structure of claim 7, further comprising:
    a passing gate electrode overlying said dielectric capacitor cap and comprising a same material as said gate electrode.

9. The semiconductor structure of claim 7, further comprising a passing gate dielectric comprising a same material as said gate dielectric and laterally contacting sidewalls of said conductive strap structure and sidewalls of said passing gate electrode.

10. The semiconductor structure of claim 1, further comprising
    at least one drain region of said access transistor that is laterally spaced from said source region by said pair of channel regions, wherein sidewalls of said pair of channel regions are parallel to sidewalls of said source region and said at least one drain region.

11. The semiconductor structure of claim 1, wherein said semiconductor fin further comprises an epitaxially-expanded source region of said access transistor contacting said source region.

12. The semiconductor structure of claim 11, wherein said semiconductor fin further comprises an epitaxially-expanded drain region of said access transistor contacting, and electrically shorting, said at least one drain region.

* * * * *